(12) United States Patent
Weida et al.

(10) Patent No.: US 8,718,105 B2
(45) Date of Patent: *May 6, 2014

(54) LASER SOURCE THAT GENERATES A RAPIDLY CHANGING OUTPUT BEAM

(75) Inventors: Miles James Weida, Poway, CA (US); David F. Arnone, Mountain View, CA (US)

(73) Assignee: Daylight Solutions, Inc., San Diego, CA (US)

( * ) Notice: Subject to any disclaimer, the term of this patent is extended or adjusted under 35 U.S.C. 154(b) by 312 days.

This patent is subject to a terminal disclaimer.

(21) Appl. No.: 13/047,667

(22) Filed: Mar. 14, 2011

(65) Prior Publication Data

US 2011/0222566 A1    Sep. 15, 2011

Related U.S. Application Data

(60) Provisional application No. 61/313,858, filed on Mar. 15, 2010.

(51) Int. Cl.
*H01S 3/00* (2006.01)

(52) U.S. Cl.
USPC .......................................................... 372/25

(58) Field of Classification Search
USPC ......... 372/102, 29.011, 97, 98, 50.12, 50.121
See application file for complete search history.

(56) References Cited

U.S. PATENT DOCUMENTS

| | | |
|---|---|---|
| 2,684,015 A | 7/1954 | Grey |
| 4,470,662 A | 9/1984 | Mumzhiu |
| 4,555,627 A | 11/1985 | McRae, Jr. |
| 4,656,641 A | 4/1987 | Scifres et al. |
| 4,737,028 A | 4/1988 | Smith |
| 4,745,276 A | 5/1988 | Broicher et al. |

(Continued)

FOREIGN PATENT DOCUMENTS

| | | |
|---|---|---|
| DE | 10205310 A1 | 9/2003 |
| EP | 0855587 A2 | 7/1998 |

(Continued)

OTHER PUBLICATIONS

US 7,733,928, 06/08/2010, Marshland, Jr. et al. (withdrawn).

(Continued)

*Primary Examiner* — Xinning Niu
*Assistant Examiner* — Tuan Nguyen
(74) *Attorney, Agent, or Firm* — Roeder & Broder LLP

(57) ABSTRACT

A laser source (10) for emitting an output beam (12) includes a first gain medium (16B) that generates a first beam (16A), a second gain medium (18B) that generates a second beam (18A), a common feedback assembly (28) positioned in the path of the first beam (16A) and the second beam (18), and a control system (32). The common feedback assembly (28) redirects at least a portion of the first beam (16A) back to the first gain medium (16B), and at least a portion of the second beam (18A) back to the second gain medium (18B). The control system (32) selectively and individually directs power to the first gain medium (16B) and the second gain medium (18). Additionally, the common feedback assembly (28) can include a feedback mover (46) that continuously adjusts the angle of incidence of the first beam (16A) and the second beam (18A) on the feedback assembly (28). Moreover, the control system (32) can selectively direct pulses of power to the gain mediums (16B) (18B) based on the position of the feedback assembly (28).

19 Claims, 7 Drawing Sheets

(56) References Cited

U.S. PATENT DOCUMENTS

| | | |
|---|---|---|
| 4,772,789 A | 9/1988 | Maram et al. |
| 4,796,266 A | 1/1989 | Banwell et al. |
| 4,852,956 A | 8/1989 | Kramer |
| 4,871,916 A | 10/1989 | Scott |
| 5,005,934 A | 4/1991 | Curtiss |
| 5,050,176 A | 9/1991 | Naito et al. |
| 5,064,988 A | 11/1991 | E'nama et al. |
| 5,068,867 A | 11/1991 | Hasenberg et al. |
| 5,082,339 A | 1/1992 | Linnebach |
| 5,082,799 A | 1/1992 | Holmstrom et al. |
| 5,140,599 A | 8/1992 | Trutna, Jr. et al. |
| 5,161,408 A | 11/1992 | McRae et al. |
| 5,172,390 A | 12/1992 | Mooradian |
| 5,181,214 A | 1/1993 | Berger et al. |
| 5,225,679 A | 7/1993 | Clarke et al. |
| 5,255,073 A | 10/1993 | Wallin et al. |
| 5,264,368 A | 11/1993 | Clarke et al. |
| 5,315,436 A | 5/1994 | Lowehnar et al. |
| 5,331,651 A | 7/1994 | Becker et al. |
| 5,430,293 A | 7/1995 | Sato et al. |
| 5,457,709 A | 10/1995 | Capasso et al. |
| 5,491,714 A | 2/1996 | Kitamura |
| 5,523,569 A | 6/1996 | Hornfeld et al. |
| 5,537,432 A | 7/1996 | Mehuys et al. |
| 5,656,813 A | 8/1997 | Moore et al. |
| 5,662,819 A | 9/1997 | Kadomura |
| 5,751,830 A | 5/1998 | Hutchinson |
| 5,752,100 A | 5/1998 | Schrock |
| 5,780,724 A | 7/1998 | Olender et al. |
| 5,824,884 A | 10/1998 | Olender et al. |
| 5,834,632 A | 11/1998 | Olender et al. |
| 5,854,422 A | 12/1998 | McKeon et al. |
| 5,862,162 A | 1/1999 | Maeda |
| 5,866,073 A | 2/1999 | Sausa et al. |
| 6,089,076 A | 7/2000 | Mueller et al. |
| 6,134,257 A | 10/2000 | Capasso et al. |
| 6,154,307 A | 11/2000 | Veronesi et al. |
| 6,157,033 A | 12/2000 | Chudnovsky |
| 6,192,064 B1 | 2/2001 | Algots et al. |
| 6,212,310 B1 | 4/2001 | Waarts et al. |
| 6,243,404 B1 | 6/2001 | Joyce |
| 6,326,646 B1 | 12/2001 | Baillargeon et al. |
| 6,327,896 B1 | 12/2001 | Veronesi et al. |
| 6,400,744 B1 | 6/2002 | Capasso et al. |
| 6,470,036 B1 | 10/2002 | Bailey et al. |
| 6,483,978 B1 | 11/2002 | Gao et al. |
| 6,553,045 B2 | 4/2003 | Kaspi |
| 6,575,641 B2 | 6/2003 | Yamabayashi et al. |
| 6,608,847 B2 | 8/2003 | Zhang et al. |
| 6,636,539 B2 | 10/2003 | Martinsen |
| 6,690,472 B2 | 2/2004 | Kulp et al. |
| 6,782,162 B2 | 8/2004 | Fukuzawa et al. |
| 6,803,577 B2 | 10/2004 | Edner et al. |
| 6,856,717 B2 | 2/2005 | Kilian |
| 6,859,481 B2 | 2/2005 | Zheng |
| 6,866,089 B2 | 3/2005 | Avila |
| 6,885,965 B2 | 4/2005 | Butler et al. |
| 6,909,539 B2 | 6/2005 | Korniski et al. |
| 6,995,846 B2 | 2/2006 | Kalayeh et al. |
| 7,032,431 B2 | 4/2006 | Baum et al. |
| 7,061,022 B1 | 6/2006 | Pham et al. |
| 7,088,076 B2 | 8/2006 | Densham et al. |
| 7,088,743 B2 * | 8/2006 | Rice et al. .................. 372/6 |
| 7,151,787 B2 | 12/2006 | Kulp et al. |
| 7,189,970 B2 | 3/2007 | Racca et al. |
| 7,265,842 B2 | 9/2007 | Paldus et al. |
| 7,345,277 B2 | 3/2008 | Zhang |
| 7,358,498 B2 | 4/2008 | Geng et al. |
| 7,424,042 B2 | 9/2008 | Day et al. |
| 7,429,734 B1 | 9/2008 | Tidwell |
| 7,466,734 B1 | 12/2008 | Day et al. |
| 7,492,806 B2 | 2/2009 | Day et al. |
| 7,535,656 B2 | 5/2009 | Day et al. |
| 7,535,936 B2 | 5/2009 | Day et al. |
| 7,590,316 B2 | 9/2009 | Dames |
| 7,623,234 B2 | 11/2009 | Puzey |
| 7,732,767 B2 | 6/2010 | Houde-Walter |
| 7,733,925 B2 | 6/2010 | Pushkarsky et al. |
| 7,755,041 B2 | 7/2010 | Killinger et al. |
| 7,796,341 B2 | 9/2010 | Day et al. |
| 7,818,911 B2 | 10/2010 | Houde-Walter |
| 7,826,503 B2 | 11/2010 | Day et al. |
| 7,848,382 B2 * | 12/2010 | Weida et al. .................. 372/102 |
| 7,873,094 B2 | 1/2011 | Day et al. |
| 7,920,608 B2 | 4/2011 | Marsland, Jr. et al. |
| 2002/0024979 A1 | 2/2002 | Vilhelmsson et al. |
| 2002/0064198 A1 | 5/2002 | Koizumi |
| 2002/0090013 A1 | 7/2002 | Murry et al. |
| 2002/0105699 A1 | 8/2002 | Miracky et al. |
| 2002/0150133 A1 | 10/2002 | Aikiyo et al. |
| 2002/0176473 A1 | 11/2002 | Mouradian |
| 2003/0043877 A1 | 3/2003 | Kaspi |
| 2003/0063633 A1 | 4/2003 | Zhang et al. |
| 2003/0095346 A1 | 5/2003 | Nasu et al. |
| 2003/0123495 A1 | 7/2003 | Cox |
| 2003/0174315 A1 | 9/2003 | Byren et al. |
| 2003/0179789 A1 | 9/2003 | Pilgrim et al. |
| 2003/0193974 A1 | 10/2003 | Frankel et al. |
| 2003/0198274 A1 | 10/2003 | Lucchetti |
| 2004/0013154 A1 | 1/2004 | Zheng |
| 2004/0032891 A1 | 2/2004 | Ikeda et al. |
| 2004/0095579 A1 | 5/2004 | Bisson et al. |
| 2004/0165640 A1 | 8/2004 | Clifford et al. |
| 2004/0208602 A1 | 10/2004 | Plante |
| 2004/0228371 A1 | 11/2004 | Kolodzey et al. |
| 2004/0238811 A1 | 12/2004 | Nakamura et al. |
| 2004/0264523 A1 | 12/2004 | Posamentier |
| 2005/0083568 A1 | 4/2005 | Nakae et al. |
| 2005/0105566 A1 | 5/2005 | Sacher |
| 2005/0199869 A1 | 9/2005 | Shi |
| 2005/0213627 A1 | 9/2005 | Masselink et al. |
| 2005/0237524 A1 | 10/2005 | Kamei |
| 2006/0056466 A1 | 3/2006 | Belenky et al. |
| 2006/0193363 A1 * | 8/2006 | Zheng et al. .................. 372/99 |
| 2006/0214107 A1 | 9/2006 | Mueller |
| 2006/0262316 A1 | 11/2006 | Baney |
| 2006/0268947 A1 | 11/2006 | Kalayeh |
| 2007/0019702 A1 | 1/2007 | Day et al. |
| 2007/0030865 A1 | 2/2007 | Day et al. |
| 2007/0047599 A1 | 3/2007 | Wysocki et al. |
| 2007/0165682 A1 | 7/2007 | He et al. |
| 2007/0291804 A1 | 12/2007 | Day et al. |
| 2008/0075133 A1 | 3/2008 | Day et al. |
| 2008/0231719 A1 | 9/2008 | Benson |
| 2008/0298406 A1 | 12/2008 | Day et al. |
| 2008/0304524 A1 | 12/2008 | Marsland, et al. |
| 2009/0015914 A1 | 1/2009 | Duncan et al. |
| 2009/0159798 A1 | 6/2009 | Weida et al. |
| 2009/0213882 A1 * | 8/2009 | Weida et al. .................. 372/23 |
| 2009/0245305 A1 * | 10/2009 | Jensen et al. ............. 372/29.011 |
| 2009/0257039 A1 | 10/2009 | Dames |
| 2009/0262768 A1 | 10/2009 | Day et al. |
| 2010/0110198 A1 | 5/2010 | Larson et al. |
| 2010/0132581 A1 | 6/2010 | Day et al. |
| 2010/0229448 A1 | 9/2010 | Houde-Walter et al. |
| 2010/0243891 A1 | 9/2010 | Day et al. |
| 2011/0006229 A1 | 1/2011 | Day et al. |

FOREIGN PATENT DOCUMENTS

| | | |
|---|---|---|
| EP | 0877 454 A1 | 11/1998 |
| EP | 0 883 220 A2 | 12/1998 |
| EP | 1359686 A2 | 11/2003 |
| EP | 2 081 265 A3 | 9/2009 |
| EP | 2113975 A2 | 11/2009 |
| GB | 2286901 A | 8/1995 |
| JP | 55087107 A | 7/1980 |
| JP | 58072108 | 4/1983 |
| JP | 03-048480 A | 3/1991 |
| JP | 07-024322 B | 1/1995 |
| JP | 2005317819 A | 11/2005 |
| WO | WO9220127 A1 | 11/1992 |
| WO | WO93/21843 A1 | 11/1993 |

(56) References Cited

FOREIGN PATENT DOCUMENTS

| WO | WO 03/067720 A2 | 8/2003 |
|---|---|---|
| WO | WO2008036881 A2 | 3/2008 |
| WO | WO2008036884 A2 | 3/2008 |

OTHER PUBLICATIONS

Hildebrandt, L. et al.. "Quantum cascade external cavity laser systems in the mid-infrared spectral range," 2004, Sacher Lasertechnik Group, Marburg, Germany.
Haim Lotem, Mode-hop suppression of Littrow grating-tuned lasers: comment, 20 Month 1994, p. 1, vol. 33, No. 00, Applied Optics.
Patrick McNicholl and Harold J. Metcalf, Synchronous cavity mode and feedback wavelength scanning in dye laser oscillators with gratings, Sep. 1, 1985, pp. 2757-2761, vol. 24, No. 17, Applied Optics, © 1985 Optical Society of America.
Corrie David Farmer, "Fab and Eval. of QCL's", Sep. 2000, Faculty of Engineering, University of Glasgow, Glasgow, UK.
M. De Labachelerie and G. Passedat, Mode-hop suppression of Littrow grating-tuned lasers, Jan. 20, 1993, pp. 269-274, vol. 32, No. 3, Applied Optics, © 1993 Optical Society of America.
S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland.
Gaetano Scamarcio, Mid-IR and THz Quantum Cascade Lasers, 2005, Physics Dept., University of Bari, Bari Italy.
Gaetano Scamarcio et al., Micro-probe characterization of QCLs correlation with optical performance, APL 78, 1177 & APL 78, 2095 (2001), APL 2002, APL 2004, University of Bari, Bari Italy.
J. Faist, THz and Mid-IR Quantum cascade lasers, QM in space, Chatillon, Mar. 31, Science 2002, University of Neuchatel, EU Projects Answer/Teranova; Agilent, Funding Swiss National Science Foundation.
Joel M. Hensley, Recent Updates in QCL-based Sensing Applications, Sep. 5-10, 2006, Physical Sciences, Inc., Andover, MA, 2nd International Workshop on Quantum Cascade Lasers, Ostuni, Italy.
J.M. Hensley et al., Demonstration of an External Cavity Terahertz Quantum Cascade Laser, Copyright 2005, Optical Society of America, Washington, DC 20036.
L. Hildebrandt et al., Quantum cascade external cavity and DFB laser systems in the mid-infrared spectral range: devices and applications, 2004, Marburg Germany.
Richard Maulini et al., Broadly tunable external cavity quantum-cascade lasers, 2005, University of Neuchatel, Neuchatel Switzerland.
Tsekoun, A. et al; "Improved performance of QCL's through a scalable, manufacturable epitaxial-side-down mounting process"; Feb. 2006.
Pushkarsky, M. et al.; "Sub-parts-per-billion level detection of NO2 using room temp. QCLs"; May 2006.
Wirtz, D. et al.; "A tuneable heterodyne infrared spectrometer"; Physikalisches Institut; University of Koln; Koln Germany Spectrochimica 2002.
Williams, B. et al.;"Terahertz QCLs and Electronics"; PhD-MIT 2003.
PCT Notification of Transmittal of International Search Report and the Written Opinion for PCT/US2011/028409 (related to the present application), dated Dec. 2, 2011, Daylight Solutions, Inc.
Electronics Letters, "Tuneable Multiwavelength Semiconductor Laser With Single Fibre Output", IEE Stevenage, GB, Aug. 15, 1991, pp. 1498-1499, XP000259820, ISSN:0013-5194, Stevenage, Herts. GB.
Weida et al., Utilizing broad gain bandwidth in quantum cascade devices, Nov. 2010, vol. 49 (11) Optical Engineering, 111120, 0091-3286/2010 © 2010 SPIE.
File:LED, 5mm, green (en).svg-Wikipedia, the free encyclopedia, Description English: A labeled drawing of a 5mm round (the "normal" type) LED. Apr. 6, 2009, 3 pages, http://en.wikipedia.org/wiki/File:LED,_5mm,_green(en).svg.

Martini, Ranier et al.,"High duty cycle operation of quantum cascade lasers based on graded superlattice active regions,"Journal of Applied Physics, Jun. 15, 2001, pp. 7735-7738, vol. 89, No. 12, XP012052642 ISSN:0021-8979, © 2001 American Institute of Physics.
Sitori, Carlo et al.,"Mid-Infrared (8.5 µm) Semiconductor Lasers Operating at Room Temperature," IEEE Photonics Technology Letters, Mar. 1997, pp. 297-299, vol. 9, No. 3, XP000684396, ISN:1041-1135, © 1997 IEE.
W.Y. Oh et al, "115 kHz tuning repetition rate ultrahigh-speed wavelength-swept semiconductor laser", received Apr. 11, 2005, accepted Aug. 9, 2005, pp. 3159-3163, vol. 30, No. 23, Optics Letters, © 2005 Optical Society of America.
Weida et al.,"Tunable QC laser opens up mid-IR sensing applications," Jul. 2006, pp. 1-5, Laser Focus World, http://www.optoiq.com/index/photonics-technologies-applications/lfw-display/lfw-articles-tools-template/_pr . . . .
G.P. Luo et al.,Grating-tuned external-cavity quantum-cascade semiconductor lasers, May 7, 2001, Applied Physics Letters, vol. 78, No. 19, © 2001 American Institute of Physics.
G. Wysocki et al.,Widely tunable mode-hop free external cavity quantum cascade laser for high resolution spectroscopic applications, Jul. 27, 2005, Applied Physics, B81, pp. 769-777, Applied Physics B Lasers and Optics.
Day et al., Miniaturized External Cavity Quantum Cascade Lasers for Broad Tunability in the Mid-Infrared, May 21, 2006, 1-55752-813-6, Lasers and Electro-Optics and 2006 Quantum Electronics and Laser Science Conference, © 2006 IEEE.
G. Totschig et al.,Mid-infrared external-cavity quantum-cascade laser XP-001161786, Oct. 15, 2002, pp. 1788-1790, Optics Letters/vol. 27, No. 20, © 2002 Optical Society of America.
Thierry Aellen et al., Continuous-wave distributed-feedback quantum-cascade lasers on a Peltier cooler, Sep. 8, 2003, pp. 1929-1931, Applied Physics Letters, vol. 83, No. 10, © 2003 American Institute of Physics.
D. Weidmann et al., Development of a compact quantum cascade laser spectrometer for field measurements of CO2 isotopes, Feb. 1, 2005, pp. 255-260, Applied PhysicsB, Lasers and Optics, Appl. Phys. B 80, published online: Sep. 29, 2004 © Springer-Verlag 2004.
Cassidy et al., Short-external-cavity module for ehanced single-mode tuning of InGaAsP and AIGaAs semiconductor diode lasers, Oct. 1991, No. 10, pp. 2385-2388, © 1991 American Institute of Physics.
M.G. Littman, H.J. Metcalf: "Spectrally narrow pulse dye laser without beam expander" Applied Optics, vol. 17, No. 14, Jul. 15, 1978, pp. 2224-2227, XP002528173 US.
Victor Rudometov and Eugene Rudometrov, Peltier Coolers, May 11, 2005, pp. 1-11, http://www.digit-life.com/article/peltiercoolers.com/ © Digit-Life.com 1997-2004.
T Topfer, KP Petrov, Y Mine, D Jundt, RF Curl, and FK Tittel, Room-temperature mid-infrared laser sensor for trace gas detection, Applied Optics, Oct. 20, 1997, pp. 8042-8049, vol. 36 No. 30, Oct. 20, 1997/Applied Optics.
Cavity Enhancing Sensors using QC Lasers, Jun. 7, 2005, pp. 1-6, http://www.infrared.phl.gov/enhanced.sensors.html, Webmaster: Pamela Kinsey, Reviewed: Nov. 23, 2004.
Transient FM Absorption Spectroscopy, Jun. 7, 2005, pp. 1 and 2, http://www.chem/tamu.edu/group/north/FM.html.
FM Spectoscopy with Tunable Diode Lasers, Application Note 7, pp. 1-10, New Focus Copyright 2001.
John Andrews and Paul Dalin,Frequency Modulation Spectroscopy, Dec. 2005, pp. 24-26, http://www.spectroscopyeurope.com.
R.F. Curl and F.K. Tittel,Tunable infrared laser spectroscopy, 1998, pp. 219-272, Annu. Rep. Prog-Chem. Sect. C, 2002.
Shawn Wehe et al., AIAA 2002-0824 Measurements of Trace Pollutants in Combustion Flows Using Room-Temperature, Mid-IR Quantum Cascade Lasers , S. Wehe, et al. (Physical Sciences, Inc.) C Gmachi and F Capasso (Bell Lab., Lucent Technologies), Jan. 2002, cover and pp. 1-7, 40th AIAA Aerospace Sciences Meeting and Exhibit 14, Jan. 17, 2002, Reno, NV.

(56) References Cited

OTHER PUBLICATIONS

W. Huang, RRA Syms, J. Stagg and A.A. Lohmann, Precision MEMS Flexure mount for a Littman tunable external cavity laser, Mar. 2004, pp. 67-75, IEE Prc-Sci Meas. Technol vol. 151, No. 2 Mar. 2004.

K. Namjou, S. Cai, E.A. Whitaker, J. Faist, C. Gmacahi, F. Capasso, D.L. Sivco and A.Y. Cho,Sensitive absorption spectroscopy with a room-temperature distributed-feedback quantum-cascade laser, 1998, pp. 219-221, 1998 Optical Society of America.

Gregory E. Hall and Simon W. North,Transient Laser Frequency Modulation Spectroscopy, 2000, pp. 243-274, Annu. Rev.Phys. Chem. 2000.51:243-74—Copyright 2000.

External-cavity quantum-cascade lasers, May 11, 2005, pp. 1-4, http://www.unine.ch/phys/meso/EC/EC.html.

Frequency stabilization of diode lasers, May 30, 2005, pp. 1-17, Santa Chawla—National Physical Laboratory, http://www.ias.ac.in/currsci/jan25/articles41.htm, National Physical Lab, New Delhi 110 012 India.

R.A. Syms, A. Lohmann, MOEMS Tuning Element for a Littrow External Cavity Laser, Dec. 2003, pp. 921-928, Journal of Microelectromechanical Systems, vol. 12, No. 6 Dec. 2003.

A.A. Koserev et al., Thermoelectrically cooled quantum cascade laser based sensor for continuous monitoring of ambient atmospheric CO—AA Koserev, FK Tittel, R Kohler, C Gmachi, F Capasso, DL Sivco, AY Cho, S Wehe and M Allen, 2002, cover and pp. 1-16, Copyright 2002 Optical Society of America (provided in parent U.S. Appl. No. 11/154,264).

Cooke, M., Producing more light than heat from quantum cascade lasers, published on-line Jan. 10, 2010, www.semiconductor-today.com, Semiconductor Today, vol. 5, Issue 1, pp. 106-107, Feb. 2010.

* cited by examiner

LASER SOURCE THAT GENERATES A RAPIDLY CHANGING OUTPUT BEAM

RELATED INVENTIONS

This application claims priority on U.S. Provisional Application Ser. No. 61/313,858, filed Mar. 15, 2010 and entitled "Multiplexed Swept Laser System". As far as permitted, the contents of U.S. Provisional Application Ser. No. 61/313,858 are incorporated herein by reference.

BACKGROUND

The usage, transportation, and storage of hazardous materials create many safety and environmental issues. More specifically, during usage, transportation, and storage of hazardous materials, leaks can release toxic or explosive gas into the surrounding environment. For example, industrial equipment used in the oil, gas, utility, and chemical industries can release toxic gas into the surrounding environment. As another example, hazardous gases can pose a threat to homeland security. In many cases, the hazardous gas is odorless, colorless, and spreads quickly. As a result thereof, it can be quite difficult to detect and locate the source of the leak.

Further, the importance of helping soldiers identify improvised explosive devices (IEDs) in the field is clear. These explosive devices can have very low vapor pressures. Thus, it can be quite difficult to locate and identify the explosive devices.

Recently, it has been determined that laser sources that generate light in the mid infrared ("MIR") range are particularly useful in absorption spectroscopy applications since many gases of interest have their fundamental vibrational modes in the MIR range, and thus present strong, unique absorption signatures within the MIR range.

Unfortunately, heat, wind, and dust all create unstable atmospheric conditions that can distort the MIR beam delivery and return paths on a sub-second time scale. This in turn can lead to significant distortions in acquired spectral patterns if the measurement time is long (e.g. greater than twenty-five milliseconds) compared to the atmospheric stability.

To understand the challenges of the problem, consider the reflectance spectra of Research Department Explosives ("RDX") residues on stainless steel. As provided herein, the vibrational spectra of the RDX residues are rich in identifying features, but require a broad spectral sweep in approximately the six to fourteen micron (6-14 um) range to acquire enough information to both detect and identify the explosive type. Further, as provided herein, the influence of the unstable atmospheric conditions on the spectral results are reduced if the spectral data is acquired rapidly (e.g. less than ten milliseconds). Thus, a field-ready spectrometer will not only require a broad spectral sweep, but also extremely fast spectral acquisition times.

Moreover, in order to detect a wide range of gases, the laser source must generate an output beam that consists of a set of sequential pulses of light that rapidly span a portion or the entire the MIR range with sufficient laser power.

SUMMARY

The present invention is directed to a laser source for emitting an output beam that consists of a plurality of output pulses of light, with at least some of the output pulses having a different center wavelength. In one embodiment, the laser source includes a first gain medium that generates a first beam, a second gain medium that generates a second beam, a common feedback assembly positioned in the path of the first beam and the second beam, and a control system. The common feedback assembly redirects at least a portion of the first beam back to the first gain medium and at least a portion of the second beam back to the second gain medium. The control system selectively and individually directs power to the first gain medium and the second gain medium.

As provided herein, the laser source is uniquely designed to provide a relatively high output power, output beam that includes a set of output pulses that span a relatively large wavelength range, in a very fast time. The laser source is well suited for use with a spectrometer to provide a broad spectral sweep in a fast time because the results of the spectrometer are less influenced by heat, wind, dust, or other unstable atmospheric conditions.

Mid-infrared (IR) spectroscopic techniques provide a means to distinguish and detect minute quantities of a chemical at a distance. The tunable mid-IR light can probe remote objects, with reflected signals being analyzed for spectroscopic signatures.

In one embodiment, the feedback mover continuously adjusts an angle of incidence of the first and second beams on at least a portion of the feedback assembly. For example, the common feedback assembly can include a reflector that redirects at least a portion of the first beam to the first gain medium and at least a portion of the second beam to the second gain medium. In this embodiment, the feedback mover can rotate the reflector.

Additionally, the laser source can include a position detector that generates a position signal that relates to the angle of incidence of the first and second beams on the feedback assembly. In this embodiment, the control system selectively directs power to the gain mediums based on the position signal from the position detector. Further, the control system can determine a center wavelength of the beams based on the position signal.

For example, the position detector can generate a first position signal when the feedback device is at a first device position, and a second position signal when the feedback device is at a second device position. In this embodiment, the control system directs a first pulse of power to the first gain medium upon receipt of the first position signal, and the control system directs a second pulse of power to the second gain medium upon receipt of the second position signal.

Moreover, the laser source can include a beam redirector assembly that redirects the first beam and the second so that the first and second beams are approximately coaxial.

The present invention is also directed to a method for generating an output beam that includes the steps of: (i) generating a first beam with a first gain medium; (ii) generating a second beam with a second gain medium; (iii) positioning a common feedback assembly in the path of the first beam and the second beam, the feedback assembly redirecting at least a portion of the first beam back to the first gain medium and at least a portion of the second beam back to the second gain medium; and (iv) selectively and individually directing power to the first gain medium and the second gain medium with a control system.

In another embodiment, the present invention is directed to a laser source that includes a first gain medium that generates a first beam; a second gain medium that generates a second beam; a third gain medium that generates a third beam; a common feedback assembly positioned in the path of the first beam, the second beam, and the third beam; and a control system that selectively and individually directs power to the first gain medium, the second gain medium, and the third gain medium. In this embodiment, the feedback assembly redirects at least a portion of the first beam back to the first gain medium, at least a portion of the second beam back to the second gain medium, and at least a portion of the third beam back to the third gain medium.

As provided herein, the common feedback assembly can include (i) a grating assembly, (ii) a reflector assembly that redirects at least a portion of each beam to the grating assembly, and (iii) a feedback mover that rotates the reflector assembly. Additionally, the grating assembly can include a first diffraction grating that reflects the first beam, a second diffraction grating that reflects the second beam, and a third diffraction grating that reflects the third beam.

Moreover, in this embodiment, the control system can selectively direct power to the gain mediums based on the position signal from the position detector. More specifically, the control system can direct a first pulse of power to the first gain medium upon receipt of a first position signal; a second pulse of power to the second gain medium upon receipt of the second position signal; and a third pulse of power to the third gain medium upon receipt of the third position signal.

Additionally, the present invention is directed to a sensor system for imaging an emitting gas. For example, the imaging system can include an imager that captures a thermal image, and the laser source described above. In this embodiment, the output beam is directed at the emitting gas and the output beam is backscattered near and/or absorbed by the emitting gas. With this design, when a target emitting gas is present, the gas absorbs and attenuates the backscattered light. As a result thereof, a shadow or contrast that corresponds to the emitting gas is clearly visible in the image that is captured by the imager. In certain embodiments, because of the unique design disclosed herein, the sensor system is very accurate and can be extremely lightweight, stable, rugged, small, self-contained, and portable.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
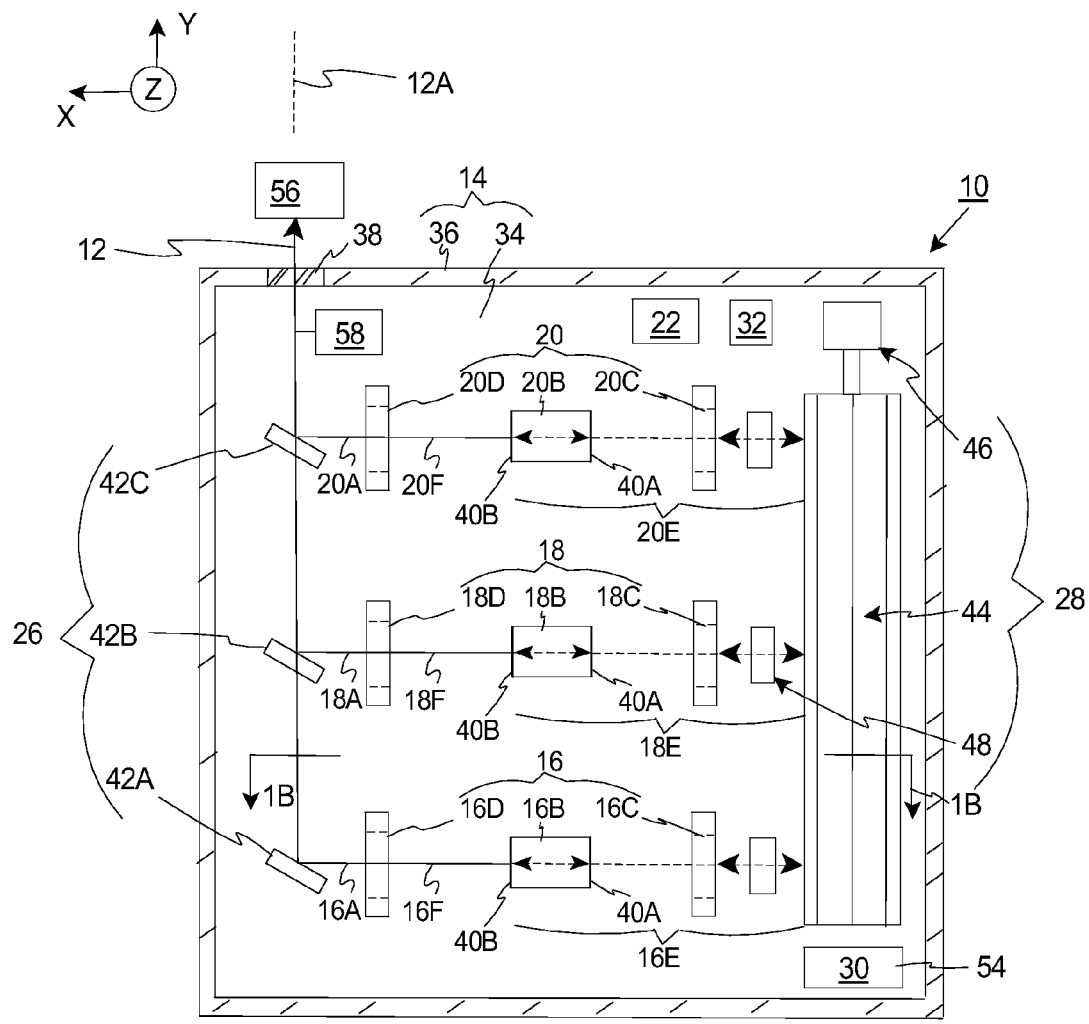
FIG. 1A is simplified top illustration in partial cut-away of a laser source having features of the present invention.
Figure 1B:
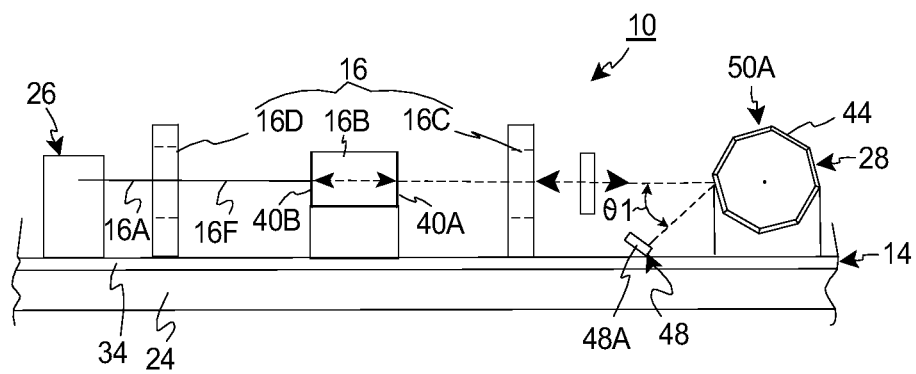
FIG. 1B is a cut-away view taken on line 1B-1B in FIG. 1A that illustrates a feedback assembly in a first position.
Figure 1C:
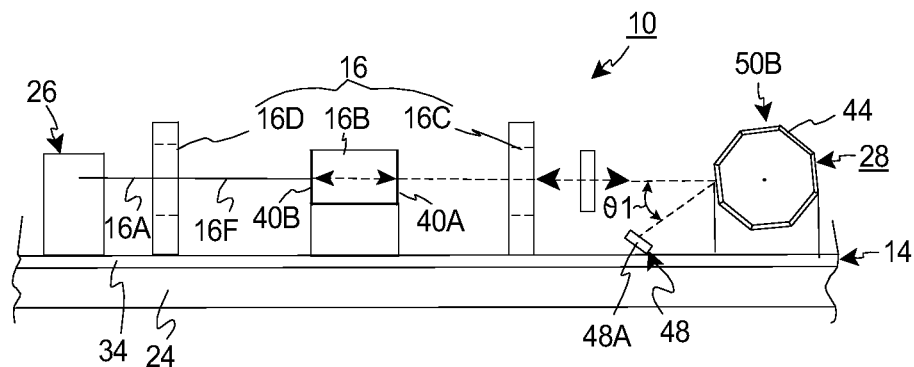
FIG. 1C is a cut-away view with the feedback assembly moved to a second position.

FIG. 1A is a simplified top illustration, in partial cut-away, and FIGS. 1B and 1C are cut-away views of a laser source 10 that is suited for imaging, locating, detecting, and/or identifying a substance (e.g. an emitting gas not shown in FIGS. 1A-1C) and/or other industrial or testing applications. In one, non-exclusive embodiment, the laser source 10 is designed to rapidly and accurately generate an output beam 12 that consists of one or more sets of sequential, wavelength specific output pulses of light that span a predetermined output wavelength range. Moreover, in certain embodiments, the output beam 12 traverses along an output beam axis 12A and originates from the same laser source 10. Additionally, the output beam 12 from the laser source 10 can be specifically tailored to target the absorption features of the substance of interest. Further, in certain embodiments, because of the unique design disclosed herein, the laser source 10 can be extremely compact, hand-held, lightweight, stable, rugged, small, self-contained, and portable.

In one embodiment, the laser source 10 is designed so that the set of output pulses of light have a center wavelength in the mid-infrared range of approximately 2-20 micrometers. In this embodiment, the laser source 10 can be designed to generate an output beam 12 consisting of a set of sequential, specific output pulses of light that span the entire or just a portion of the mid-infrared range. Further, the laser source 10 is particularly useful in absorption spectroscopy applications since many gases of interest have strong, unique absorption signatures within the mid-infrared range. Alternatively, the laser source 10 can be designed to generate one or more output pulses of light having a center wavelength of greater than or lesser than 2-20 micrometers.

A number of Figures include an orientation system that illustrates an X axis, a Y axis that is orthogonal to the X axis, and a Z axis that is orthogonal to the X and Y axes. It should be noted that these axes can also be referred to as the first, second and third axes.

As an overview, the laser source 10 is uniquely designed to provide a relatively high output power, accurate output beam 12 including a set of output pulses of light that span a relatively large wavelength range, in a very fast time (e.g. approximately ten milliseconds or less). The laser source 10 is well suited for use with a spectrometer to provide a broad spectral sweep in a fast time because the results of the spectrometer are less influenced by heat, wind, dust, or other unstable atmospheric conditions that can distort the delivery and return paths of the output beam 12.

The design of the laser source 10 can be varied to achieve the desired type of gas detection or other usage of the laser source 10. In FIGS. 1A-1C, the laser source 10 includes a source frame 14, a plurality of lasers 16, 18, 20, a power source 22, a temperature controller 24, a beam redirector assembly 26, a wavelength dependent ("WD") feedback assembly 28, a position detector 30, and a control system 32 that cooperate to generate the output beam 12. The design of each of these components can be varied pursuant to the teachings provided herein. Further, it should be noted that the laser source 10 can be designed with more or fewer components than described herein.

The source frame 14 supports at least some of the components of the laser source 10. In one embodiment, the lasers 16, 18, 20, the power source 22, the temperature controller 24, the beam redirector assembly 26, the WD feedback assembly 28, the position detector 30, and the control system 32 are each fixedly secured, in a rigid arrangement to the source frame 14; and (ii) the source frame 14 maintains these components in precise mechanical alignment to achieve the desired wavelength of each of the output pulses of the set. Further, the laser control system 32, the power source 22, and the temperature controller 24 can be secured to source frame 14. With this design, all of the critical components are fixed to the source frame 14 in a stable manner, and the laser source 10 can be self-contained and extremely portable. Alternatively, for example, the power source 22, the temperature controller 24, and/or the laser control system 32 can be separate from and external to the source frame 14.

In FIGS. 1A-1C, the source frame 14 includes a rigid mounting base 34, a cover 36 that encloses the components of the laser source 10, and a window 38 that allows the output beam 12 to exit the cover 36. Alternatively, for example, the source frame 14 can be designed without the cover 36, without the window 38, and/or can have a configuration different from that illustrated in the Figures.

The mounting base 34 provides a rigid platform for fixedly mounting the lasers 16, 18, 20, the beam redirector assembly 26, and the feedback assembly 28. In the Figures, the mounting base 34 is illustrated as being generally rectangular plate shaped. In one embodiment, the mounting base 34 is a single mechanical ground plane that provides structural integrity to the laser source 10. Alternatively, the mounting base 34 can have a configuration that is different than that illustrated in Figures.

In certain embodiments, the mounting base 34 is made of rigid material that has a relatively high thermal conductivity. In one non-exclusive embodiment, the mounting base 34 has a thermal conductivity of at least approximately 170 watts/meter K. With this design, in addition to rigidly supporting the components of the laser source 10, the mounting base 34 also readily transfers heat away from the lasers 16, 18, 20 to the temperature controller 24. For example, the mounting base 34 can be fabricated from a single, integral piece of copper, copper-tungsten or other material having a sufficiently high thermal conductivity. The one piece structure of the mounting base 34 maintains the fixed relationship of the components mounted thereto and contributes to the small size and portability of the laser source 10.

In one embodiment, the cover 36 is shaped somewhat similar to an inverted, open rectangular box. For example, the cover 36 can be hermetically sealed to the mounting base 34 in an air tight manner. This allows the source frame 14 to provide a controlled environment around some of the components of the laser source 10. For example, the environment enclosed by the cover 36 can be filled with a fluid such as nitrogen or an air/nitrogen mixture to keep out moisture and humidity; or it can be subjected to a vacuum. In certain embodiments, the controlled environment keeps out gases that can absorb infrared light, such as water and carbon dioxide, or the substance that is being detected.

In certain embodiments, the overall size of the source frame 14 is relatively small so that the laser source 10 is very portability. For example, the source frame 14 can have dimensions of approximately 20 centimeters (height) by 20 centimeters (width) by 20 centimeters (length) (where length is taken along the propagation direction of the laser beam) or less, and more preferably, the source frame 14 has dimensions of approximately 3 centimeters (height) by 4 centimeters (width) by 5 centimeters (length). Still alternatively, the source frame 14 can have dimensions of less than approximately 10 millimeters (height) by 25 millimeters (width) by 30 millimeters.

The number of the lasers 16, 18, 20 can be varied pursuant to the teachings provided herein to achieve the desired output wavelength range. In FIG. 1A, the laser source 10 includes three, spaced apart lasers 16, 18, 20. Alternatively, the laser source 10 can be designed to include more than three or fewer than three lasers 16, 18, 20.

The design of each of the lasers 16, 18, 20 can be varied pursuant to the teachings provided herein to achieve the desired predetermined wavelength range. In one embodiment, each of the lasers 16, 18, 20 is somewhat similar in design. However, as provided herein, each of the lasers 16, 18, 20 can be specifically designed to generate a different portion of the predetermined wavelength range. Thus, as desired predetermined wavelength range is increased, the number of lasers 16, 18, 20 can be increased, with each laser 16, 18, 20 generating a separate portion of the predetermined wavelength range.

Figure 1D:
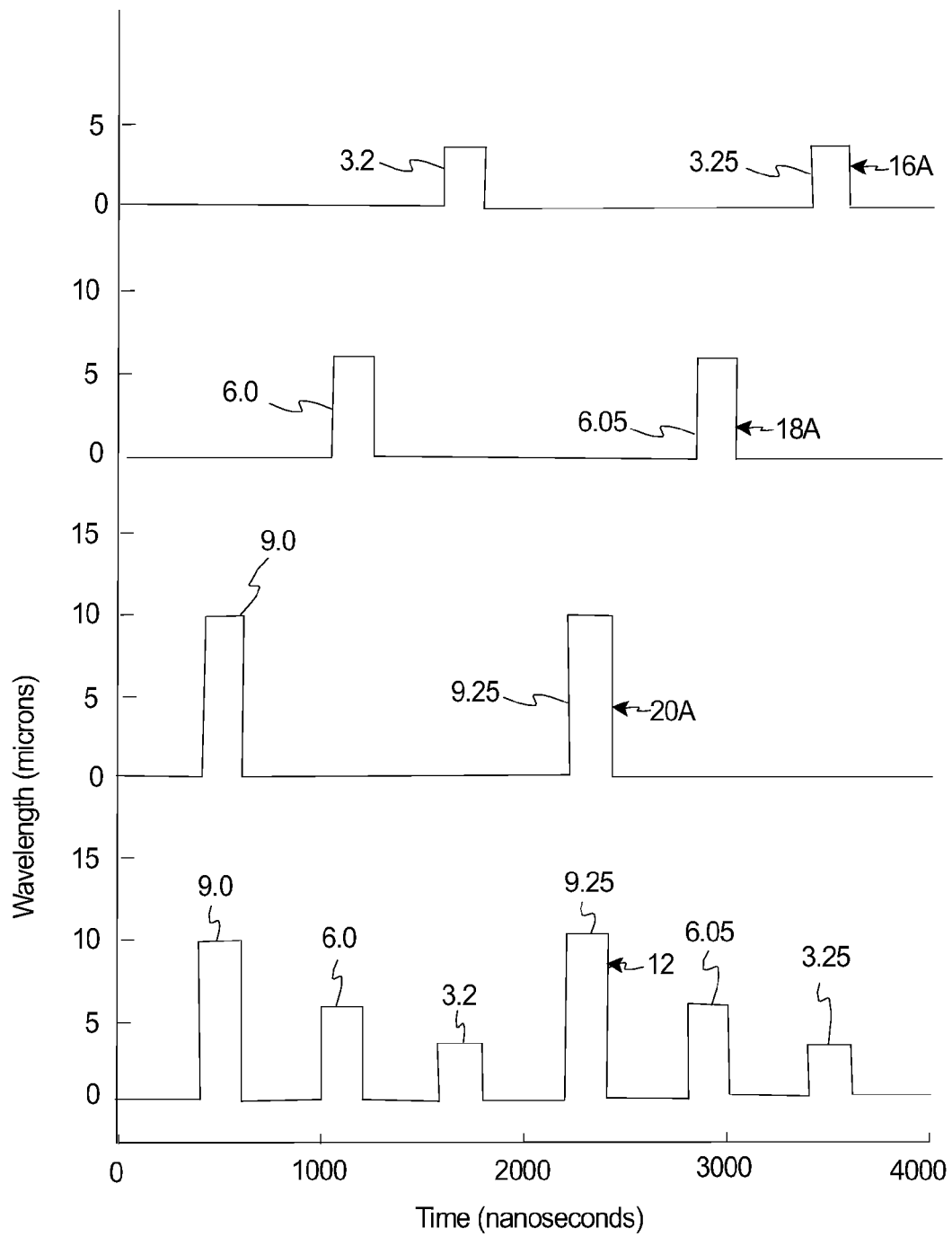
FIG. 1D is a simplified graph that illustrates a portion of an output wavelength range for the laser source of FIG. 1A.

As provided herein, (i) power is directed to the first laser 16 to sequentially generate a first beam 16A that consists of a plurality of first pulses of light; (ii) power is directed to the second laser 18 to sequentially generate a second beam 18A that consists of a plurality of second pulses of light; and (iii) power is directed to the third laser 20 to sequentially generate a third beam 20 that consists of a plurality of third pulses of light. FIG. 1D is a graph that illustrates (i) a wavelength profile versus time for a couple of first pulses of the first beam 16A; (ii) a wavelength profile versus time for a couple of second pulses of the second beam 18A; (iii) a wavelength profile versus time for a couple of third pulses of the third beam 20A; and (iv) a wavelength profile for the resulting output beam 12. Referring to FIGS. 1A and 1D, in certain embodiments, (i) the first laser 16 is designed so that the center wavelength of each of the plurality of first pulses of light is in a first range portion of the predetermined wavelength range; (ii) the second laser 18 is designed so that the center wavelength of each of the plurality of second pulses of light 18A is in a second range portion of the predetermined wavelength range; and (iii) the third laser 20 is designed so that the center wavelength of each of the plurality of third pulses of light 20A is in a third range portion of the predetermined wavelength range. With this design, the first beam 16A, the second beam 18A, and the third beam 20A can be combined into the output beam 12 that consists of pulses of light that cover the entire predetermined wavelength range. Stated in another fashion, through a combination of three beams 16A, 18A, 20A, the predetermined wavelength range can be quickly covered.

The desired predetermined wavelength range can be varied to suit the absorption profile/detection range of the substance being located and/or identified. In certain embodiments, a relatively large wavelength range is necessary to achieve specificity when analyzing mixtures of chemicals. Further, the resolution between different spectral signatures for different chemicals increases as the spectral range that is being analyzed is increased, thus allowing individual components to be detected.

In one non-exclusive embodiment, the predetermined wavelength range includes (i) the first range portion of approximately 3.2-3.7 microns; (ii) the second range portion of approximately 6-10 microns; and (iii) a third range portion of approximately 10-12 microns. In this design, (i) the first laser 16 generates the first beam 16A that consists of a set of sequential, specific, different center wavelength, first pulses of light that span the 3.2-3.7 micron range; (ii) the second laser 18 generates the second beam 18A that consists a set of sequential, specific, different center wavelength, second pulses of light that span the 6-10 micron range; and (iii) the third laser 20 generates the third beam 20A that consists of a set of sequential, specific, different center wavelength, third pulses of light that span the 10-12 micron range. In this embodiment, there is a gap between the first range portion and the second range portion. Alternatively, the lasers 16, 18, 20 can be designed so that (i) all of the range portions partly overlap, (ii) one or more of the range portions cover another part the mid-infrared spectrum, and/or (iii) one or more of the range portions is larger or smaller than described above.

In simplified example illustrated in FIG. 1D, (i) the first beam 16A has a first, first pulse of light having a center wavelength of 3.2 microns, and a second, first pulse of light having a center wavelength of 3.25 microns; (i) the second beam 18A has a first, second pulse of light having a center wavelength of 6 microns and a second, second pulse of light having a center wavelength of 6.05 microns; and (iii) the third beam 20A has a first, third pulse of light having a center wavelength of 9 microns, and a second, third pulse of light having a center wavelength of 9.25 microns.

Referring back to FIGS. 1A-1C, (i) the first laser 16 includes a first gain medium 16B, a first cavity optical assembly 16C, and a first output optical assembly 16D; (ii) the second laser 18 includes a second gain medium 18B, a second cavity optical assembly 18C, and a second output optical assembly 18D; and (iii) the third laser 20 includes a third gain medium 20B, a third cavity optical assembly 20C, and a third output optical assembly 20D.

In one embodiment, each gain medium 16B, 18B, 20B directly emits the respective beams 16A, 18A, 20A without any frequency conversion. For example, one or more of the gain mediums 16B, 18B, 20B can be a Quantum Cascade (QC) gain medium, an Interband Cascade (IC) gain medium, or a mid-infrared diode. As a non-exclusive example, the first laser 16 can utilize a mid-infrared diode, and the other two lasers 18, 20 can utilize Quantum Cascade gain mediums. Alternatively, another combination of the gain mediums can be utilized. In another example, each of the laser 16, 18, 20 can utilize a Quantum Cascade gain medium.

In certain embodiments, in order to achieve good contrast in the captured image, is may be necessary to generate the output beam 12 having a peak optical power of greater than approximately 1 milliwatt. Further, in certain embodiments, an even better contrast can be achieved with the output beam 12 having a peak optical power greater than approximately 100 milliwatts. The tunable Quantum Cascade gain mediums 16B, 18B, 20B provide the high power to meet these spectroscopic applications. In one non-exclusive embodiment, each Quantum Cascade gain medium 16B, 18B, 20B is approximately 2 millimeters by 0.5 millimeters, by 90 micrometers. Suitable Quantum Cascade gain mediums 16B, 18B, 20B can be purchased from Alpes Lasers, located in Switzerland.

As provided herein, the fabrication of each gain medium 16B, 18B, 20B can be altered to achieve the desired output frequency range for each gain medium 16B, 18B, 20B. For example, the first gain medium 16B can be fabricated to have a tuning range that matches the first range portion; the second gain medium 18B can be fabricated to have a tuning range that matches the second range portion; and the third gain medium 20B can be fabricated to have a tuning range that matches the third range portion.

As a non-exclusive example, the thickness of the wells/barriers of a Quantum Cascade gain medium determine the wavelength characteristic of the respective Quantum Cascade gain medium. Thus, fabricating a Quantum Cascade gain medium of different thickness enables production of the laser having different output frequencies within the MIR range.

In one embodiment, each gain medium 16B, 18B, 20B includes (i) a first facet 40A that faces the respective cavity optical assembly 16C, 18C, 20C and the feedback assembly 28, and (ii) a second facet 40B that faces the output optical assembly 16D, 18D, 20D. In this embodiment, each gain medium 16B, 18B, 20B emits from both facets. In one embodiment, each first facet 40A is coated with an anti-reflection ("AR") coating, and each second facet 40B is coated with a reflective coating. The AR coating allows light directed from the respective gain medium 16B, 18B, 20B at the first facet 40A to easily exit as a beam 16A, 18A, 20A directed at the feedback assembly 28; and allows the light beam 16A, 18A, 20A reflected from the feedback assembly 28 to easily enter the respective gain medium 16B, 18B, 20B.

The beams 16A, 18A, 20A exit from the respective second facet 16B and are redirected by the beam redirector assembly 26 to form the output beam 12. The reflective coating on the second facet 16B of each gain medium 16B, 18B, 20B reflects at least some of the light 16A, 18A, 20A that is directed at the second facet 16B of each gain medium 16B, 18B, 20B back into the respective gain medium 16B, 18B, 20B. In one non-exclusive embodiment, the AR coating can have a reflectivity of less than approximately 2 percent, and the reflective coating can have a reflectivity of between approximately 2-95 percent.

In one embodiment, (i) the reflective coating on the second facet 40B of the first gain medium 16B acts as an output coupler (e.g. a first end) of a first external cavity 16E; (ii) the reflective coating on the second facet 40B of the second gain medium 18B acts as an output coupler (e.g. a first end) of a second external cavity 18E; and (iii) the reflective coating on the second facet 40B of the third gain medium 20B acts as an output coupler (e.g. a first end) of a third external cavity 20E. Further, in this embodiment, the feedback assembly 28 is spaced apart from the gain medium 16B, 18B, 20B, and defines a second end of each external cavity 16E, 18E, 20E. The term external cavity 16E, 18E, 20E is utilized to designate that the feedback assembly 28 is positioned outside of the respective gain medium 16B, 18B, 20B. In FIGS. 1A-1C, the respective external cavity 16E, 18E, 20E is not external to the source frame 14.

The first cavity optical assembly 16C is positioned between the first gain medium 16B and the feedback assembly 28 along a first lasing axis 16F (along the X axis in FIG. 1A), and collimates and focuses the first beam 16A that passes between these components. Similarly, the second cavity optical assembly 18C is positioned between the second gain medium 18B and the feedback assembly 28 along a second lasing axis 18F (along the X axis in FIG. 1A), and collimates and focuses the second beam 18A that passes between these components. Further, the third cavity optical assembly 20C is positioned between the third gain medium 20B and the feedback assembly 28 along a lasing axis 20F (along the X axis in FIG. 1A), and collimates and focuses the third beam 20A that passes between these components.

For example, each cavity optical assembly 16C, 18C, 20C can include one or more lens. For example, the lens can be an aspherical lens having an optical axis that is aligned with the respective lasing axis 16F, 18F, 20F. In one embodiment, to achieve the desired small size and portability, the lens has a relatively small diameter. In alternative, non-exclusive embodiments, the lens has a diameter of less than approximately 5 or 10 millimeters, and a focal length of approximately 1, 2, 3, 4, 5, 6, 7, 8, 9, 10, 11, 12, 13, 14, 15, 16, 17, 18, 19, or 20 mm and any fractional values thereof. The lens can comprise materials selected from the group of Ge, ZnSe, ZnS Si, CaF, BaF or chalcogenide glass. However, other materials may also be utilized. The lens may be made using a diamond turning or molding technique. The lens can be designed to have a relatively large numerical aperture (NA). For example, the lens can have a numerical aperture of at least approximately 0.6, 0.7, or 0.8. The NA may be approximated by the lens diameter divided by twice the focal length. Thus, for example, a lens diameter of 5 mm having a NA of 0.8 would have a focal length of approximately 3.1 mm.

The first output optical assembly 16D is positioned between the first gain medium 16B and the beam redirector assembly 26 in line with the first lasing axis 16F to collimate and focus the first beam 16A that exits the second facet 40B of the first gain medium 16B. Similarly, the second output optical assembly 18D is positioned between the second gain medium 18B and the beam redirector assembly 26 in line with the second lasing axis 18F to collimate and focus the second beam 18A that exits the second facet 40B of the second gain medium 18B. Further, the third output optical assembly 20D is positioned between the third gain medium 20B and the beam redirector assembly 26 in line with the third lasing axis 20F to collimate and focus the third beam 20A that exits the second facet 40B of the third gain medium 20B. For example, each output optical assembly 16D, 18D, 20D can include one or more lens that are somewhat similar in design to the lens of the cavity optical assemblies 16C, 18C, 20C.

The power source 22 provides electrical power to the gain mediums 16B, 18B, 20B, the control system 32, and the temperature controller 24. In one embodiment, the power source 22 is a battery that is secured to the source frame 14. For example, the battery can be nickel metal hydrate. Alternatively, the power source 22 can be external to the source frame 14. For example, the power source 22 can be an external battery or a power outlet.

The gain mediums 16B, 18B, 20B generate quite a bit of heat. Accordingly, the temperature controller 24 can be an important component that is needed to remove the heat, thereby permitting long lived operation of the laser source 10 and consistent optical output power. The temperature controller 24 can be used to control the temperature of the gain mediums 16B, 18B, 20B, the mounting base 34, and/or one or more of the other components of the laser source 10. Further, by controlling the temperature, the temperature controller 24 can be used to maintain the relative position of the gain mediums 16B, 18B, 20B, and the other components of the laser source 10.

In one embodiment, the temperature controller 24 includes a thermoelectric cooler and a temperature sensor (not shown). The thermoelectric cooler may be controlled to effect cooling or heating depending on the polarity of the drive current thereto. In one embodiment, the thermoelectric cooler is fixed to the bottom of the mounting base 34 so that the thermoelectric cooler is in direct thermal communication with the mounting base 34, and so that the thermoelectric cooler can provide additional rigidity and support to the mounting base 34. In one embodiment, the top of the thermoelectric cooler is approximately the same size as the bottom surface of the mounting base 34. This promotes good heat transfer between the thermoelectric cooler and the mounting base 34, and maximizes the support for the mounting base 34 provided by the thermoelectric cooler. The thermoelectric cooler can be fixedly secured to the mounting base with bolts, epoxy, welding, solder or other suitable means.

Alternatively, an intermediate plate may be attached between the thermoelectric cooler and the mounting base 34.

The temperature sensor provides temperature information that can be used to control the operation of the thermoelectric cooler so that the thermoelectric cooler can maintain the desired temperature of the laser source 10. The temperature sensor can be positioned on the mounting base 34 near the gain mediums 16B, 18B, 20B and can be used to monitor the temperature of the gain mediums 16B, 18B, 20B.

It should be noted that fine tuning of the beams 16A, 18A, 20A can be achieved by controlling the temperature of the respective gain medium 16B, 18B, 20B, such as by changing the DC bias current. Such temperature tuning is relatively narrow and may be used to vary the wavelength by approximately 1-2 gigahertz/Kelvin which is typically less than 0.01% of the peak emission wavelength.

Additionally, or alternatively, the source frame 14 can be mounted to a heat sink (not shown) inside a larger housing (not shown) which may also contain additional equipment including cooling fans and vents to further remove the heat generated by the operation of the laser source 10.

The beam redirector assembly 26 redirects and combines the beams 16A, 18A, 20A to form the output beam 12 that consists of the plurality of output pulses of light that cover the entire predetermined spectral wavelength range. In one non-exclusive embodiment, the beam redirector assembly 26 redirects the first, second, and third beams 16A, 18A, 20A so that they are approximately coaxial when exiting the laser 10. In FIG. 1A, the beam redirector assembly 26 includes (i) a reflector 42A (e.g. a mirror) the redirects the first beam 16A approximately ninety degrees so the first beam 16A is coaxial with the output beam axis 12A (directed along the Y axis); (ii) a first beam splitter 42B that transmits the first beam 16A, and that redirects the second beam 18A approximately ninety degrees so the second beam 18A is coaxial with the output beam axis 12A (directed along the Y axis); and (iii) a second beam splitter 42C that transmits the first beam 16A and the second beam 18A, and that redirects the third beam 20A approximately ninety degrees so the third beam 20A is coaxial with the output beam axis 12A (directed along the Y axis). For example, (i) the first beam splitter 42B can be a bandpass filter that passes light at the wavelength of the first beam 16A and that reflects light at the wavelength of the second beam 18A; and (ii) the second beam splitter 42C can be a bandpass filter designed to pass light at the wavelength of the first beam 16A and the second beam 18A, and to reflect light at the wavelength of the third beam 20A. Alternatively, the beam redirector assembly 26 can have a design different than that illustrated in FIG. 1A.

In another non-exclusive example, the beam redirector assembly 26 can include one or more beam splitters that pass a beam having one polarization and reflect a beam having another polarization. For example, the first beam 16A and the second beam 18A can have a vertical polarization and the third beam 20A can have an orthogonal polarization. In this example, the (i) the first beam splitter 42B can be a bandpass filter that passes light at the wavelength of the first beam 16A and that reflects light at the wavelength of the second beam 18A; and (ii) the second beam splitter 42C can be a filter designed to pass light having a vertical polarization, and reflect light having an orthogonal polarization.

The common feedback assembly 28 (i) reflects the first beam 16A back to the first gain medium 16B, and is used to precisely select and adjust the lasing frequency of the first external cavity 16E and the wavelength of the first pulses of light; (ii) reflects the second beam 18A back to the second gain medium 18B, and is used to precisely select and adjust the lasing frequency of the second external cavity 18E and the wavelength of the second pulses of light; and (iii) reflects the third beam 20A back to the third gain medium 20B, and is used to precisely select and adjust the lasing frequency of the third external cavity 20E and the wavelength of the third pulses of light. Stated in another fashion, the common feedback assembly 28 is used to feed back to the respective gain medium 16B, 18B, 20B a relatively narrow band wavelength which is then amplified in the respective gain medium 16B, 18B, 20B. In this manner, the beams 16A, 18A, 20A may be tuned with the feedback assembly 28 without adjusting the respective gain medium 16B, 18B, 20B. Thus, with the external cavity arrangements disclosed herein, the feedback assembly 28 dictates what wavelength will experience the most gain in each laser 16, 18, 20, and thus dominate the wavelength of the beams 16A, 18A, 20A.

A number of embodiments of the feedback assembly 28 are described below. In FIGS. 1A-1C, the feedback assembly 28 includes a common redirector 44, a feedback mover 46, and a grating assembly 48 that cooperate to rapidly adjust the lasing frequency of the external cavity 16E, 18E, 20E and the wavelength of each of the beams 16A, 18A, 20A. The size, shape, and design of each of these components can be varied pursuant to the teachings provided herein.

Figure 1E:
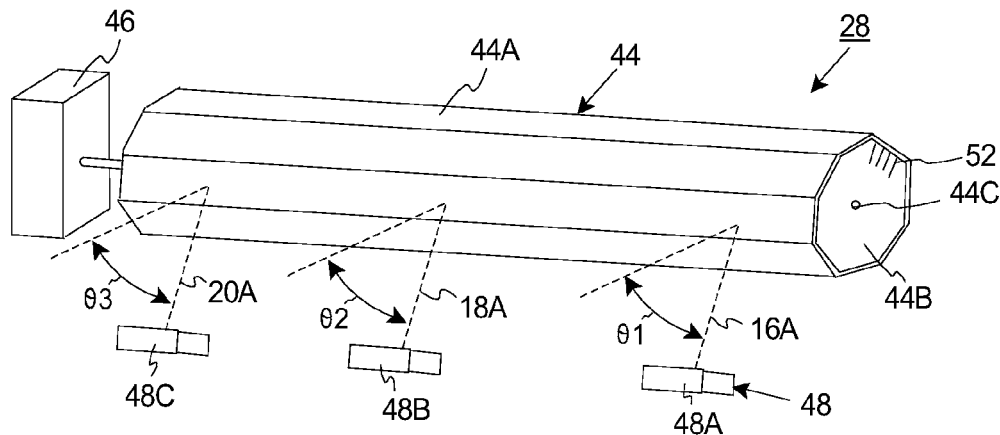
FIG. 1E is a simplified perspective view of one embodiment of a feedback assembly having features of the present invention.

FIG. 1E is a simplified perspective view of the common redirector 44, the feedback mover 46, and the grating assembly 48. The common redirector 44 redirects the first, second, and third beams 16A, 18A, 20A that exit the first facet 40A (illustrated in FIG. 1A) of the gain mediums 16B, 18B, 20B (illustrated in FIG. 1A) towards the grating assembly 48, and redirects the first, second, and third beams 16A, 18A, 20A reflected off of the grating assembly 48 back to the respective gain mediums 16B, 18B, 20B. In one embodiment, the common redirector 44 includes one or more reflectors 44A (e.g. mirrors), and a redirector housing 44B that retains the one or more reflectors 44A. In this embodiment, the one or more reflectors 44A are rotated by the feedback mover 46 about a redirector axis 44C. The number of mirrors 44A used in the common redirector 44 can be varied. For example, in the embodiment illustrated in FIG. 1E, the common redirector 44 is a multi-faceted mirror that includes eight mirrors 44A that are secured to a multi-sided redirector housing 44B that has an octagonal shaped cross-section. Alternatively, the common redirector 44 can include more than eight or fewer than eight mirrors 44A.

In this embodiment, the feedback mover 46 continuously moves the common redirector 44 to quickly adjust (i) a first angle of incidence θ1 of the first beam 16A on the grating assembly 48; (ii) a second angle of incidence θ2 of the second beam 18A on the grating assembly 48; and (iii) a third angle of incidence θ3 of the third beam 20A on the grating assembly 48. For example, the feedback mover 46 can continuously rotate the common redirector 44 about the redirector axis 44C. In this embodiment, the feedback mover 46 can be a rotary motor that rotates at between approximately five (5) to fifty (50) revolutions per second. Stated in another fashion, in alternative non-exclusive embodiments, the feedback mover can rotate at approximately 5, 10, 20, 30, 40, or 50 revolutions per second. However, the assembly can be designed to rotate at a higher or slower rate than described above.

The grating assembly 48 (i) reflects the first beam 16A, and is used to precisely select and adjust the wavelength of the first beam 16A; (ii) reflects the second beam 18A, and is used to precisely select and adjust the wavelength of the second beam 18A; and (iii) reflects the third beam 20A, and is used to precisely select and adjust the wavelength of the third beam 20A. In one embodiment, the grating assembly 48 includes (i) a fixed first diffraction grating 48A that selects the wavelength of the first beam 16A; (ii) a fixed, second diffraction grating 48B that selects the wavelength of the second beam 18A; and (iii) a fixed third diffraction grating 48C that selects the wavelength of the third beam 20A. In this embodiment, each of the diffraction gratings 48A, 48B, 48C has wavelength dependent reflectivity. A typical diffraction grating 48A, 48B, 48C includes a glass or polished metal reflector surface having a large number of very fine parallel grooves or slits. The pitches of each diffraction grating 48A, 48B, 48C can be individually designed to achieve the desired tuning range for each individual laser 16, 18, 20.

With this design, the spinning reflectors 44A direct the beams 16A, 18A, 20A to the respective grating 48A, 48B, 48C in a Littrow configuration. This accomplishes a fast sweep, with the advantage of multiple sweeps per motor revolution. In addition, the length of the redirector 44 can be extended as needed to tune more than three lasers 16, 18, 20. Further, the common reflector 44 naturally synchronizes the spectral sweep of each laser 16, 18, 20 to the same fast time scale over the same time range. Thus, with the common reflector 44, the tuning of two or more lasers 16, 18, 20 can be easily synchronized. Further, as provided herein, the gain mediums 16B, 18B, 20B, and the diffraction gratings 48A, 48B, 48C can each be individually designed so that each laser 16, 18, 20 has access to a different selected tuning range.

As provided herein, as the reflector 44 is rotated, the angle between the respective grating 48A, 48B, 48C normal and the intracavity beam 16A, 18A, 20A changes, thus scanning the laser wavelength. Stated in another fashion, rotation of the redirector 44 (i) changes the first angle of incidence θ1 of the first beam 16A on the first diffraction grating 48A to preferentially select a single wavelength which is the first order diffracted light from the grating 48A; (ii) changes the second angle of incidence θ2 of the second beam 18A on the second diffraction grating 48B to preferentially select a single wavelength which is the first order diffracted light from the grating 48B; and (iii) changes the third angle of incidence θ3 of the third beam 20A on the third diffraction grating 48C to preferentially select a single wavelength which is the first order diffracted light from the grating 48C.

In alternative, non-exclusive embodiments, the feedback assembly 28 controls the center wavelength of each beam 16A, 18A, 20A to within approximately 0.1, 0.01, 0.001, or 0.0001 micrometers. In certain embodiments, with the designs provided herein, each of the beams 16A, 18A, 20A has a relatively narrow line width. In non-exclusive examples, the laser source 10 can be designed so that the line width of one or more of the beams 16A, 18A, 20A is less than approximately 5, 4, 3, 2, 1, 0.8, 0.5, or 0.1 cm-1. This provides more than adequate resolution for spectrally evaluation of many substances. For example, most spectrometers used for condensed phase spectroscopy have a resolution of 4 cm$^{-1}$. Alternatively, the laser source 10 can be designed so that the line width of one or more of the beams 16A, 18A, 20A is greater than approximately 7, 8, 9, or 10 cm-1. The spectral width of the beams 16A, 18A, 20A can be adjusted by adjusting the cavity parameters of the external cavities 16E, 18E, 20E. For example, the spectral width of the beams 16A, 18A, 20A can be increased or decreased by changing the focal length of the respective cavity optical assembly 16C, 18C, 20C.

FIG. 1B illustrates the redirector 44 in a first redirector position 50A and FIG. 1C illustrates that the redirector 44 has been rotated to a second redirector position 50B. Comparing these Figures, the first angle of incidence θ1 is greater when the redirector 44 is in the first redirector position 50A than in the second redirector position 50B. With this design, when the redirector 44 is in the first redirector position 50A, the first beam 16A has a first center wavelength; and when the redirector 44 is in the second redirector position 50B, the first beam 16A has a second center wavelength that is different than the first center wavelength. The amount of difference in wavelength will depend upon (among other things) how much the first angle of incidence θ1 has changed and the characteristics of the first diffraction grating 48A.

With the design illustrated in FIGS. 1A-1C, the tuning of the wavelength of the beams 16A, 18A, 20A is realized by rotating the redirector 44 and changing the angle of incidences θ1, θ2, θ3. Further, the feedback mover 46 can move the redirector 44 to a plurality of alternative redirector positions 50A, 50B (only two are illustrated in FIGS. 1B, 1C) to quickly adjust the angle of incidences θ1, θ2, θ3.

In many spectroscopic applications, it is desirable to tune over the entire range of the laser 10 in a time that is short compared to the environment being evaluated. For example, if the laser 10 is used to target gases in the open air, the target gases are susceptible to intensity fluctuations due to atmospheric turbulence. In order to approximately "freeze" the atmosphere and acquire a spectrum with a substantially unvarying intensity profile, it is necessary to scan the laser 10 faster than the atmospheric turbulence.

As non-exclusive examples, with the designs provided herein, the feedback mover 46 moves the redirector 44 to generate the spectrum of output pulses of the output beam 12 in less than approximately one, two, three, four, five, seven or ten milliseconds. This allows for the acquisition of a complete molecular spectrum before the measurement volume significantly changes due to conditions such as atmospheric turbulence.

The position detector 30 accurately measures and monitors the position of at least a portion of the feedback assembly 28 and provides a position signal to the control system 32 that relates to the position of at least a portion of the feedback assembly 28. Stated in another fashion, the position detector 30 can generate a separate position signal that relates to each position of the moving redirector 44. For example, the position detector 28 can generate a first position signal when the redirector 44 is at the first device position 50A (illustrated in FIG. 1B) and a second position signal when the redirector 44 is at the second device position 50B (illustrated in FIG. 1C). Further, the position signals relate to the angles of incidence θ1, θ2, θ3 of the first, second, and third beams 16A, 18A, 20A on the grating assembly 48. As non-exclusive examples, the position detector 30 can be an optical encoder, or a Hall type sensor.

In one non-exclusive example, the position detector 30 is an optical encoder that includes a plurality of encoder marks 52 (a few are illustrated in FIG. 1E) on the redirector housing 44B, and an optical reader 54. With this design, the optical reader 54 can monitor the encoder marks 52 and provide a position signal that relates to the position of the redirector 44 relative to the beams 16A, 18A, 20A, and values of the angle of incidences θ1, θ2, θ3.

The control system 32 controls the operation of the laser source 10 including the electrical power to the feedback mover 46, the electrical power that is directed to the gain mediums 16B, 18B, 20B (e.g. controls the gain mediums 16B, 18B, 20B by controlling the electron injection current), and the temperature controller 24. For example, the control system 32 can include one or more processors. In FIG. 1A, the control system 32 is rigidly and fixedly mounted to the source frame 14 so that the laser source 10 is portable and rugged. Alternatively, for example, the control system 32 can be external to the source frame 14.

In one embodiment, the control system 32 receives the position signals from the position detector 30 and directs power to the feedback mover 46 to continuously move the redirector 44. Further, the control system 32 can direct power to the gain mediums 16B, 18B, 20B in a fashion that minimizes heat generation in, and power consumption of the gain mediums 16B, 18B, 20B while still achieving the desired set of output pulses. For example, to realize low power consumption, the power to the gain mediums 16B, 18B, 20B can be pulsed on and off. Pulsing of the power to the gain mediums 16B, 18B, 20B not only reduces power consumption, it also reduces the thermal load produced by the laser 10, and allows higher temperature operation such that more efficient above-ambient temperature control can be used to stabilize the laser 10. The benefits of running the laser 10 in pulsed mode extend to a reduction in size and complexity due to the simpler and more robust above-ambient temperature control and battery operation. This in turn aids in creating a truly portable laser 10 by reducing the size and weight, and enabling cordless battery operation. It also enables more compact and rugged lasers 10 to be built that can be field-deployed.

The collection of accurate spectra requires that the wavelength of the output beam 12 be precisely known as the laser 10 is tuned. In certain embodiments, the control system 32 directs the pulses of power to the gain mediums 16B, 18B, 20B based on the position signal received from the position detector 30. In this example, the control system 32 can direct (i) a pulse of power to the first gain medium 16B every time the optical reader 54 reads a first predetermined number of encoder marks 52; (ii) a pulse of power to the second gain medium 18B every time the optical reader 54 reads a second predetermined number of encoder marks 52; and (iii) a pulse of power to the third gain medium 20B every time the optical reader 54 reads a third predetermined number of encoder marks 52. With this design, the pulses to each gain medium 16B, 18B, 20B is synchronized with respect to the position detector 30, and multiplexed with respect to each other to allow the pulse train to be decoded by one detector.

Stated in another fashion, the control system 32 can sequentially direct a pulse of power to each gain medium 16B, 18B, 20B at each of the plurality of rotational positions so that the laser source 10 generates the set of output pulses of the output beam 12. For example, the control system 32 can direct a pulse of power to one of the gain mediums 16B, 18B, 20B upon receipt of each new position signal. As a result thereof, the specific wavelength of the output pulses of the output beam 12 will not be influenced by variations in speed of the motor 48.

In one embodiment, the pulsing of the power to the gain mediums 16B, 18B, 20B allows the laser pulses to be tied directly to the angular rotation by employing a phase-locked-loop (PLL) technique where the position signals from the position detector 30 are up-converted in frequency and phase locked to the angular signals to allow the pulses of power to be fired at precise angular increments that are well characterized. These angles for each power pulse can then be converted to an accurate wavelength scale for the recorded chemical spectra.

Accuracy and sensitivity are also enabled by using boxcar integration techniques with the position signals to allow the high-frequency pulsing of the laser to be analyzed in real time. This is necessary to use the full spectral range of the laser even as it is rapidly tuning.

Figure 1F:
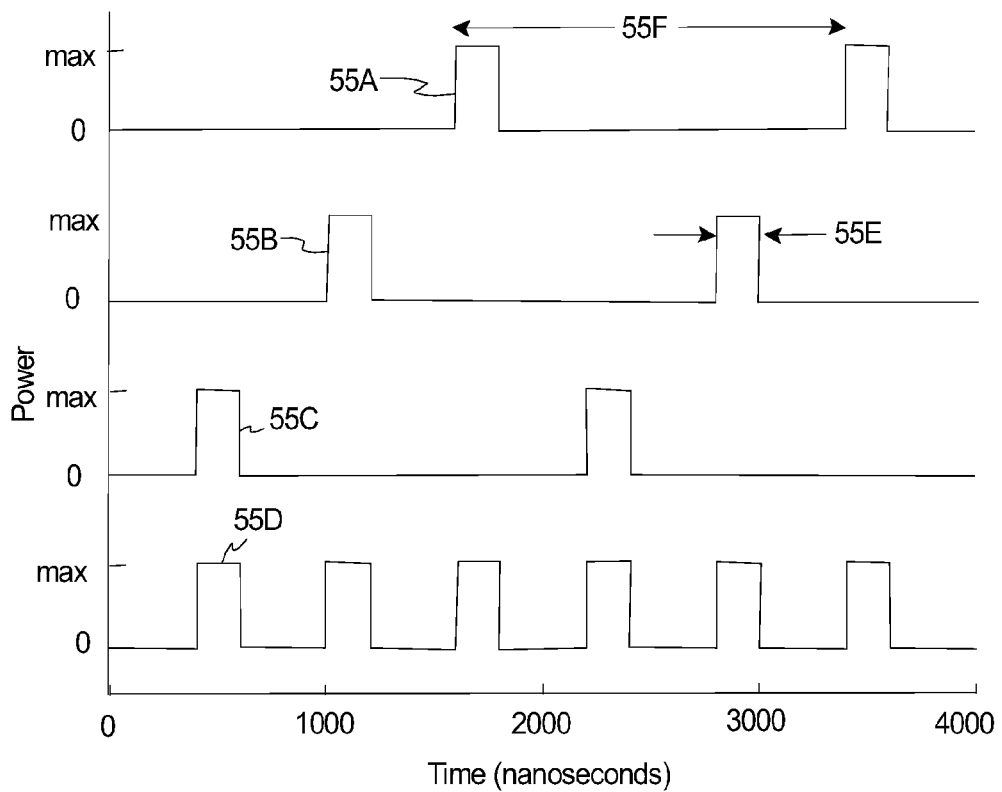
FIG. 1F is a simplified graph that illustrates the power directed to the laser source of FIG. 1A.

FIG. 1F illustrate one, non-exclusive embodiment of the timing of how the control system 32 (not shown in FIG. 1F) can direct power pulses to the gain mediums 16B, 18B, 20B (not shown in FIG. 1F). In this embodiment, (i) a first power profile 55A represents the power pulses directed to the first gain medium 16B; (ii) a second power profile 55B represents the power pulses directed to the second gain medium 18B;

(iii) a third power profile 55C represents the power pulses directed to the third gain medium 20B; and (iv) an overall power profile 55D represents the power pulses directed to the three gain mediums 16B, 18B, 20B. In this embodiment, the control system 32 sequentially directs the maximum power to each of the gain mediums 16B, 18B, 20B. More specifically, moving from left to right in FIG. 1F, the control system 12 (i) first directs a pulse of power to the third gain medium 20B, (ii) next, directs a pulse of power to the second gain medium 18B, (iii) subsequently directs a pulse of power to the first gain medium 16B, and (iv) next repeats the sequence again. Thus, in this embodiment, the control system 32 sequentially pulses the power to the gain mediums 16B, 18B, 20B.

In FIG. 1F, the multiplexed pulsing scheme, has a pulse width of approximately two hundred nanoseconds and a repetition rate of approximately 55 kHz for each of the gain mediums 16B, 18B, 20B. This provides an approximately eleven percent duty cycle for each gain mediums 16B, 18B, 20B, with enough pulse width to provide spectral infill to reduce mode noise contributions to tuning. The fully multiplexed pulse sequence is densely packed, but can be used for fast digitization and boxcar integration for demultiplexing. Alternatively, the control system 32 can direct pulses of power to one or more of the gain mediums 16B, 18B, 20B at a different pulse width or repetition rate than illustrated in FIG. 1F. For example, in alternative, non-exclusive embodiments, the control system 30 can control each pulse of power to have a duration of approximately 3, 4, 5, 10, 25, 50, 75, 100, 150, 200, 300, 400, 500, 600 or 700 nanoseconds. Further, the control system 32 can direct a different shaped power profile with different power levels to each of the gain mediums 16B, 18B, 20B.

Additionally, the laser source 10 can be calibrated using a wavelength measurement device 56 during manufacturing of the laser source 10. More specifically, with the laser source 10 activated, the feedback mover 46 can be used to change the angles of incidence θ1, θ2, θ3, while monitoring position of the redirector 44 with the position detector 30, and wavelength of the output pulses of the output beam 12 with the wavelength measurement device 56. With this design, each position signal of the position detector 30 can be corresponded to a measured center wavelength of one of the output pulses of output beam 12. Stated in another fashion, the control system 30 can determine a center wavelength of the output pulses of the output beam 12 based on the position signal.

In one embodiment, the control system 32 utilizes field a programmable gate array ("FPGA") to control the pulses of power to lasers 16, 18, 20 and the rotation of the redirector 44. This FPGA can be used for subsequent high speed (50 MHz) digitization of the reference and signal detectors, then real-time box car integration of the pulsed signals to construct spectral sweeps. Further, the control system 32 can include an embedded microprocessor that takes this data from the FPGA to assemble spectra, which can then relayed to an external laptop (not shown in FIG. 1A) via a fast USB connection. Subsequently, the spectra can be analyzed and fit in real time to determine chemical composition and concentration through the software.

The multiplexed swept laser 10 requires one additional degree of synchronization. In certain embodiments, because only one detector is being used for capturing the return signal, the lasers 16, 18, 20 must be temporally multiplexed. As shown in FIG. 1F, power is directed to the three lasers 16, 18, 20 so that the lasers 16, 18, 20 are fired in sequence. The master pulse sequence is controlled by the FPGA, using the position signals from the position detector 30 to lock the pulsing to the tuning. This way, it is possible to demultiplex each laser 16, 18, 20 signal in the FPGA after the detector signal is sent through the fast (e.g. 50 MHz) digitizer. The three separate lasers 16, 18, 20 spectral sweeps can then be assembled in the microprocessor and stitched together in the software to provide one complete spectrum.

In certain embodiments, the multiplexed swept laser source 10 has a single reference detector 58 that picks off a portion of the multiplexed beam 12. This reference detector 58 signal is digitized, boxcar averaged, and demultiplexed in the FPGA and microprocessor to construct a reference power level for all wavelengths and tuning ranges accessed by the multiplexed swept laser 10. This signal is used together with the output beam 12 that is directed at the substrate being evaluated, either in transmission or reflection, and a signal detector that is also digitized and processed the same way as the reference detector 58. The signal and reference data consist of optical power vs. wavelength, and can be used to construct an absorption spectrum. Further analysis of this spectrum is used to identify and detect different chemicals through their unique spectroscopic fingerprints.

Figure 2A:
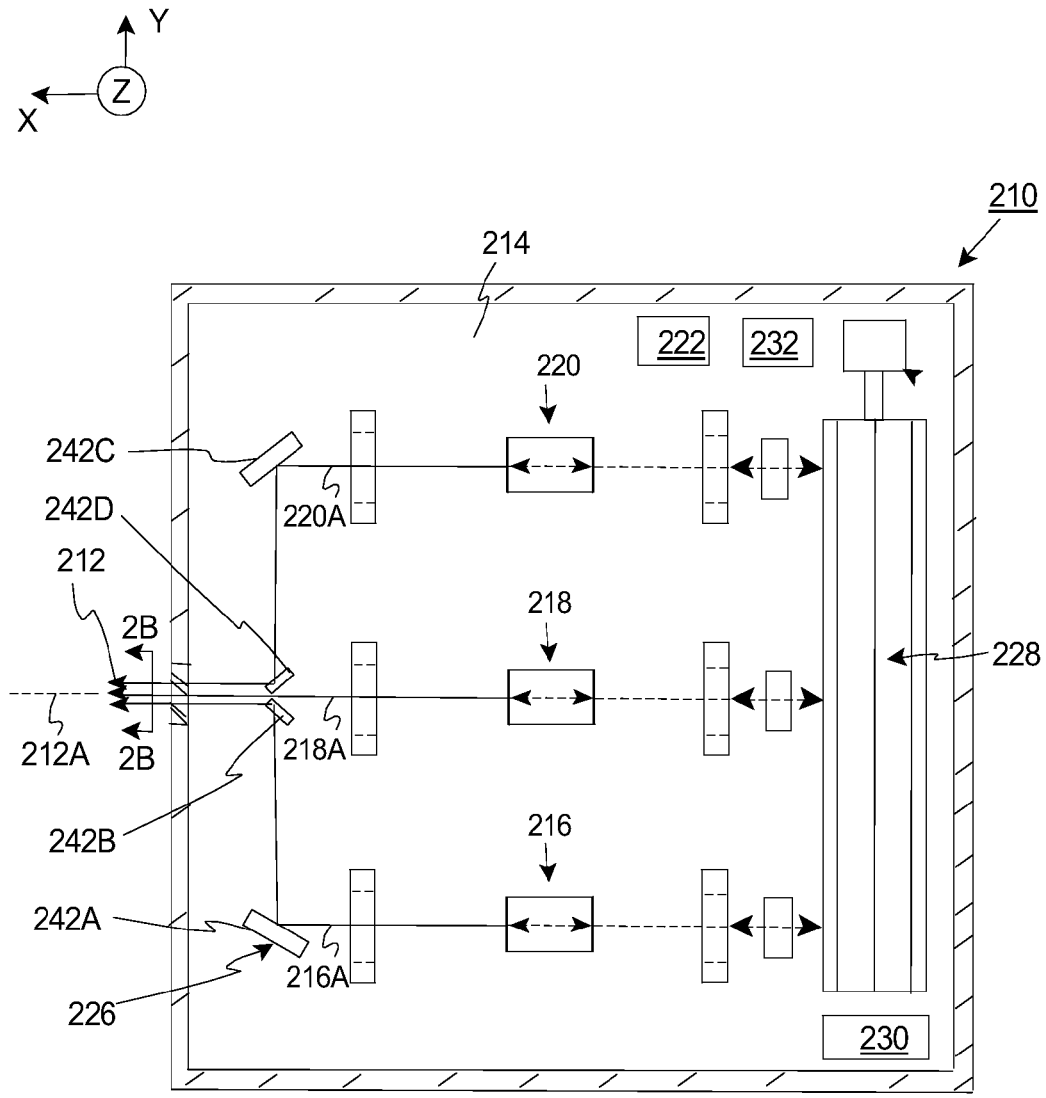
FIG. 2A is simplified top illustration in partial cut-away of another embodiment of a laser source having features of the present invention.

FIG. 2A is simplified top illustration, in partial cut-away, of another embodiment of a laser source 210 having features of the present invention. In this embodiment, the laser source 210 includes a source frame 214, a plurality of lasers 216, 218, 220, a power source 222, a wavelength dependent feedback assembly 228, a position detector 230, and a control system 232 that are similar to the corresponding components described above. However, in this embodiment, the beam redirector assembly 226 is slightly different. More specifically, in this embodiment, the beam redirector assembly 226 includes (i) a first reflector 242A (e.g. a mirror) the redirects the first beam 216A approximately ninety degrees so the first beam 216A is directed along the Y axis; (ii) a second reflector 242B (e.g. a mirror) the redirects the first beam 216A approximately ninety degrees so the first beam 216A is approximately parallel to the second beam 218A; (iii) a third reflector 242C (e.g. a mirror) the redirects the third beam 220A approximately ninety degrees so the third beam 220A is directed along the Y axis; and (iv) a fourth reflector 242D (e.g. a mirror) the redirects the third beam 220A approximately ninety degrees so the third beam 220A is approximately parallel to the second beam 218A. With this design, the beam redirector assembly 226 redirects the beams 216A, 218A, 220A so that they are approximately coaxial with an output beam axis 212A of the output beam 212 exiting the laser source 210. Further, with this design, the first, second, and third beams 216A, 218A, 220A can be combined without loss of optical power with this tiling scheme.

Figure 2B:
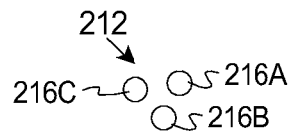
FIG. 2B is a simplified cut-away view taken on line 2B-2B in FIG. 2A.

FIG. 2B is a simplified cut-away illustration of the first, second, and third beams 216A, 218A, 220A just after the first, second, and third beams 216A, 218A, 220A are brought towards each other to form the output beam 212. In one non-exclusive embodiment, each of the first, second, and third beams 216A, 218A, 220A has a size at the laser 210 of approximately three millimeters in diameter. If the three beams 216A, 218A, 220A are packed in a parallel configuration, with approximately a one millimeter separation, the beams 216A, 218A, 220A will overlap at distances greater than approximately one meter from the laser 210.

Figure 3:
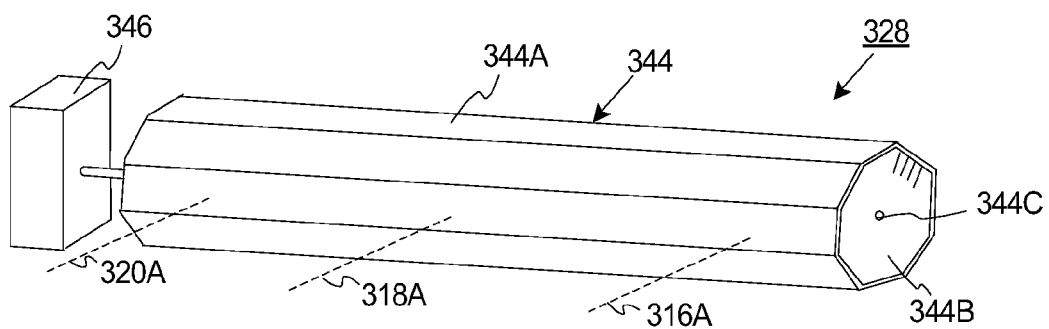
FIG. 3 is a simplified perspective view of another embodiment of a feedback assembly having features of the present invention.

FIG. 3 is a simplified perspective view of another embodiment of a WD feedback assembly 328. In this embodiment, the feedback assembly 328 includes a grating assembly 344, and a feedback mover 346 that cooperate to rapidly adjust the wavelength of each of the first, second, and third beams 316A, 318A, 320A. In FIG. 3, the common grating assembly 344 includes one or more diffraction gratings 344A, and a housing 344B that retains the one or more diffraction gratings 344A. In this embodiment, the one or more diffraction gratings 344A are rotated by the feedback mover 346 about an axis 344C. The number of diffraction gratings 344A can be varied. For example, in the embodiment illustrated in FIG. 3, the feedback assembly 328 is a multi-faceted grating that includes eight diffraction gratings 344A that are secured to a multi-sided housing 344B that has an octagonal shaped cross-section. Alternatively, the feedback assembly 328 can include more than eight or fewer than eight diffraction gratings 344A.

In this embodiment, the feedback mover 346 continuously moves the diffraction gratings 344A to quickly adjust (i) a first angle of incidence of the first beam 316A on the grating assembly 344 to adjust the wavelength of the first beam 316A; (ii) a second angle of incidence of the second beam 318A on the grating assembly 344 to adjust the wavelength of the second beam 318A; and (iii) a third angle of incidence of the third beam 320A on the grating assembly 344 to adjust the wavelength of the third beam 320A.

With this design, the spinning gratings 344A accomplish a fast sweep, with the advantage of multiple sweeps per motor revolution. In addition, the length of the grating assembly 344 can be extended as needed to tune more than three lasers. Further, the grating assembly 344 naturally synchronizes the spectral sweep of each laser to the same fast time scale over the same time range.

Figure 4:
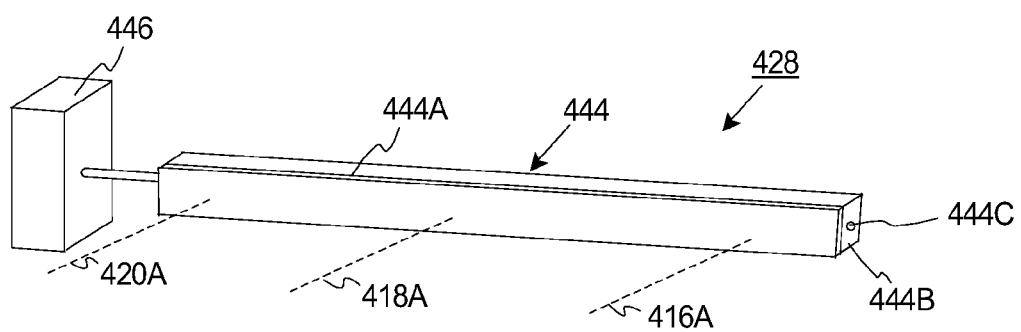
FIG. 4 is a simplified perspective view of still another embodiment of a feedback assembly having features of the present invention.

FIG. 4 is a simplified perspective view of another embodiment of a WD feedback assembly 428. In this embodiment, the feedback assembly 428 includes a grating assembly 444, and a feedback mover 446 that cooperate to rapidly adjust the wavelength of each of the first, second, and third beams 416A, 418A, 420A. In FIG. 4, the common grating assembly 444 includes a single diffraction grating 444A, and a housing 444B that retains the diffraction grating 444A. In this embodiment, the diffraction grating 444A is rotated by the feedback mover 446 about an axis 444C.

In this embodiment, the feedback mover 446 continuously moves the diffraction grating 444A to quickly adjust (i) a first angle of incidence of the first beam 416A on the grating assembly 444 to adjust the wavelength of the first beam 416A; (ii) a second angle of incidence of the second beam 418A on the grating assembly 444 to adjust the wavelength of the second beam 418A; and (iii) a third angle of incidence of the third beam 420A on the grating assembly 444 to adjust the wavelength of the third beam 420A.

With this design, the spinning grating 444A still accomplishes a fast sweep. In addition, the length of the grating assembly 444 can be extended as needed to tune more than three lasers. Further, the grating assembly 444 naturally synchronizes the spectral sweep of each laser to the same fast time scale over the same time range.

For example, if the feedback mover 446 rotates the grating 444A at a rotation speed of 600 rpm (10 Hz) with and angular tuning range of 30°, a full sweep of spectrum can be performed in approximately eight milliseconds.

As provided herein the laser pulses can be synchronized with the feedback assembly to provide a stable wavelength axis. This technology can be incorporated with a sensor to provide a fully-integrated spectrometer used for both gas- and condensed-phase measurements.

Figure 5:
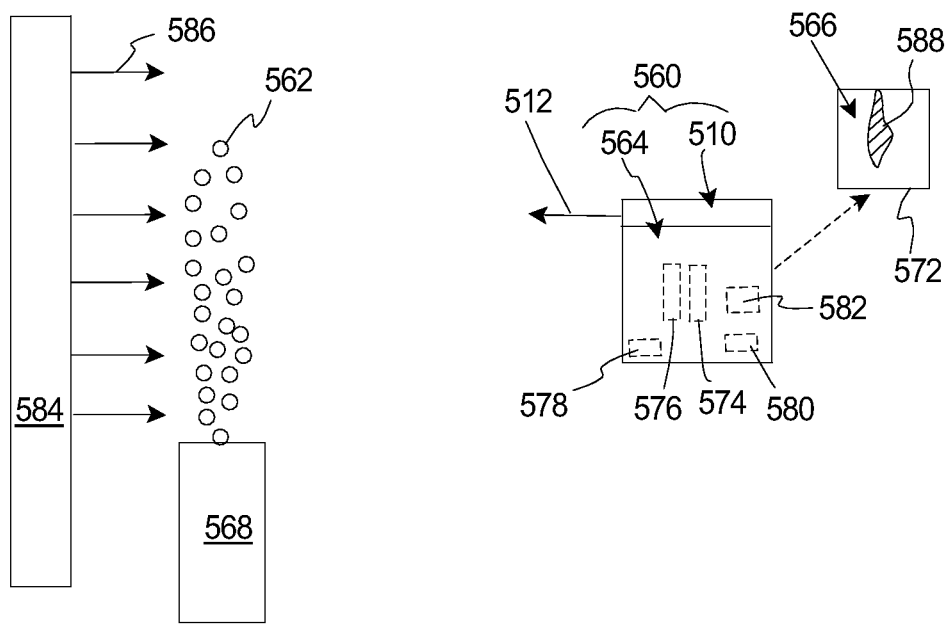
FIG. 5 is simplified illustration of a sensor system having features of the present invention and an emitting gas.

FIG. 5 is simplified illustration of a substance sensor system 560 having features of the present invention and a substance 562 e.g. an emitting gas. In this embodiment, the sensor system 560 includes (i) a laser source 510 that illuminates the area near the emitting gas 562, and (ii) an imager 564 (i.e. an infrared camera) that captures real-time, high resolution thermal images 566 of the emitting gas 562 that can be displayed or recorded for future viewing. As non-exclusive examples, the sensor system 560 is useful for locating substances 562 (i.e. leaks) in the oil, gas, utility, chemical industries, as well as locating emitting gas 562 for homeland security. Further, the sensor assembly 560 can be used to identify and locate IEDs.

In certain embodiments, because of the unique design disclosed herein, the sensor system 560 can be extremely accurate, compact, hand-held, lightweight, stable, rugged, small, self-contained, and portable.

In one embodiment, the type of substance 562 detectable by the sensor system 560 can include any gas 562 having molecules that absorb ("absorption features") in the MIR range. A non-exclusive example of gases 562 having absorption features in the MIR range that can be detected includes, but is not limited to, (i) sulfur hexafluoride (SF6), (ii) Acetylchloride, (iii) Ethylene, (iv) Freon (such as dichlorodifluoromethane), (v) Propenal, (vii) Tricholorethylene, (viii) methane (CH4), (ix) ethylene (C2H4), (x) ethane (C2H6), (xi) hydrogen chloride (HCl), (xii) ammonia (NH3), (xiii) nitrous oxide (NO), (xiv) hydrazine (N2H4), and (xv) monomethyl hydrazine (MMH). Yet another example of gases includes (i) chemical agents such as mustard gas or other gases that may pose problems for the military, and/or (ii) chlorine, hydrogen peroxide, or other gases that may pose problems for homeland security.

A non-exclusive list of possible sources 568 of the emitting gas 562 includes IEDs, containers, power plants, industrial equipment, gas lines, storage tanks, and electrical equipment.

The laser source 510 can be similar in design to the laser sources 10, 210 described above. For example, the laser source 510 can rapidly and accurately generate an output beam 512 consisting of one or more sets of sequential, wavelength specific output pulses that span a predetermined detection range (e.g. the mid-infrared range).

The imager 564 captures the thermal image 566 of the gas 562 and the surrounding environment. In one embodiment, the imager 564 is an infrared camera that provides real-time, high resolution thermal images 566 of the emitting gas 562 that can be displayed on a display 572 or recorded for future viewing. In FIG. 5, for convenience, the display 572 is illustrated as being positioned away from the imager 564. However, the display 572 can be a screen that is attached to the imager 564.

In one embodiment, the imager 564 includes an image sensor 574 (illustrated in phantom), a filter assembly 576 (illustrated in phantom), a storage system 578 (illustrated in phantom), and an imager control system 580.

The image sensor 574 receives the light that passes through the filter assembly 576 and converts the light into electricity. Examples of suitable image sensors 574 can include microbolometers, quantum well infrared photodetectors, or thermal light valve technology sold by Redshift Systems Corporation, located in Burlington, Mass.

The filter assembly 576 limits the wavelength of the light that is directed at the image sensor 574. For example, if the imager 564 is designed to detect any gas that absorbs in the MIR range, the filter assembly 576 can be designed to transmit all light in the MIR range, and block all light having a wavelength that is greater or lesser than the MIR range. With this design, the image sensor 574 responds primarily to desired wavelength, and ignores other background thermal emissions.

The storage system 578 stores the various images. Non-exclusive examples of suitable storage systems 578 include flash memory, a floppy disk, a hard disk, or a writeable CD or DVD.

The imager control system 580 is electrically connected to and controls the operation of the electrical components of the imager 564. The imager control system 580 can include one or more processors and circuits and the imager control system 580 can be programmed to perform one or more of the functions described herein. The imager control system 580 receives information from the image sensor 574 and generates the image 566. Additionally, or alternatively, the imager control system 580 can further enhance the image 566 with color or other features that will further identify the location or type of emitting gas 562. In certain embodiments, the imager control system 580 can analyze the information from one or more images 566 to identify the one or more specific emitting gases 562 that are present and/or determine the quantity of one or more emitting gases 562 that are present.

In FIG. 5, the imager 564 and the laser source 510 share a common housing. Alternatively, the imager 564 and the laser source 510 can have separate housings.

Additionally, the imager 564 can include a battery 582 (illustrated in phantom) for powering the imager 564. This allows for the portable operation of the imager 564 in remote locations. Alternatively, for example, the imager 564 and the laser source 510 can share a common battery, or the sensor system 560 can be connected with an electrical cord to a power outlet.

As illustrated in FIG. 5, the output beam 512 is directed at a background 584 near a possible site of a gas leakage. The imager 564 captures both backscattered light 586 (illustrated as arrows) that is reflected off of the background 584 and background radiation. When a detectable emitting gas 562 is present, the backscattered light 586 is highly attenuated. This produces a region of contrast or shadow 588 on the image 566 that corresponds to and clearly illustrates the emitting gas 562. The background 584 can be any object that reflects the output beam 512.

In one embodiment, the wavelength of the output pulses of the output beam 512 is synchronized with the imager 564 so that imager control system 580 knows the wavelength of the output pulses at the time each image 566 is captured so that the gas 562 captured in the image 566 can be specifically identified. For example, if the gas 562 appears in a first image captured when the output beam 512 is at a first center wavelength and the gas 572 does not appear in a second image when the output beam 512 is at a second center wavelength, the type of gas 562 captured in the first image can be identified if the value of the first wavelength is known.

More specifically, if it is desired to locate emitting gases X, Y, and Z, the laser source 510 can be controlled to generate a set of sequential, specific, different center wavelength output pulses that span a portion or the entire the MIR range. In this embodiment, after generating the set of output pulses, the imager control system 580 can analyze the images 566 captured by the imager 564 and compare the images 566 to a lookup table (not shown) that includes the absorption profiles of the gases in interest. With this information, the imager control system 580 can identify the gases 562 detected and/or how much of each of the gases is present. Further, with this design, the sensor system 560 scans for a relatively large number of gases 562 that have absorption in the scanning range.

Figure 6:
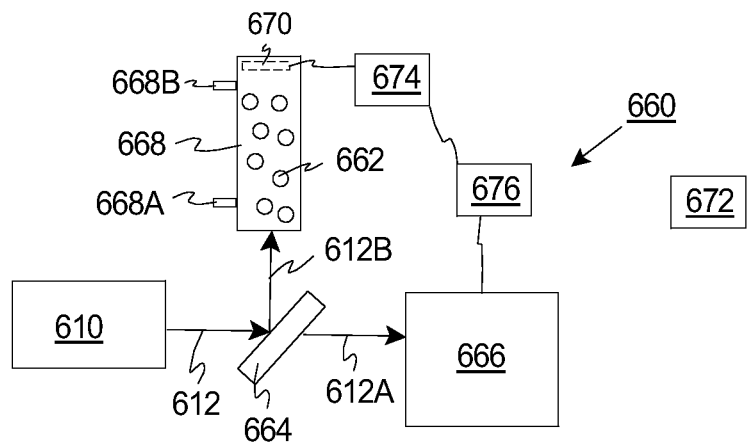
FIG. 6 is a simplified illustration of another embodiment of a sensor system having features of the present invention.

FIG. 6 is simplified illustration of another embodiment of a sensor system having features of the present invention. In this embodiment, the sensor system includes a laser source 610 (similar to those described above) that generates an output beam 612 consisting of a plurality of output pulses, and a spectrometer 660 that utilizes the output pulses to analyze one or more substance 662 (illustrated as circles). For example, the substance 662 can be a liquid, gas or solid.

In this embodiment, the spectrometer 660 includes (i) a beam splitter 664 that splits the output beam 612 into two beams 612A, 612B, (ii) a reference detector 666 that receives one of the beams 612A and that analyzes the beam 612A to determine the unattenuated power level, (iii) a sample area 668 (e.g. a container) that receives the other beam 612B and the one or more gases 662, (iv) a signal detector 670 (illustrated in phantom) that detects the beam 612B after traveling through the sample area 668, (v) control electronics 672 for powering the laser 610 and the spectrometer 660, (vi) acquisition electronics 674 for digitizing and integrating the detector signals from the signal detector 670, and (vii) analysis electronics 676 for assembling the data into spectra and analyzing the spectra to determine the concentration and/or presence of different chemicals in the gases 662.

For example, the sample area 668 can be a container that receives the one or more substances 662. The sample area 668 can include an area input 668A and an area output 668B that allows the substances 662 to be changed in the sample area 668. In alternative embodiments, the sample area 668 receives a gas or condensed phase sample in a cell, or a condensed phase sample in an attenuated-total-reflectance (ATR) device.

While the particular systems as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A laser source for emitting an output beam that consists of a plurality of output pulses of light, with at least some of the output pulses having a different center wavelength, the laser source comprising:
   a first gain medium having a first facet, the first gain medium generating a first beam that exits the first facet; wherein the first gain medium includes a second facet and the first beam exits the second facet; wherein the second facet is at least partly reflective;
   a second gain medium having a first facet, the second gain medium generating a second beam that exits the first facet; wherein the second gain medium includes a second facet and the second beam exits the second facet; wherein the second facet is at least partly reflective;
   a common feedback assembly positioned in the path of the first beam and the second beam, the common feedback assembly redirecting at least a portion of the first beam back to the first gain medium and at least a portion of the second beam back to the second gain medium; wherein the common feedback assembly includes a reflector assembly that redirects at least a portion of the first beam to the first gain medium and at least a portion of the second beam to the second gain medium; wherein for the first gain medium, the second facet defines a first end of a first external cavity and the common feedback assembly defines a second end of the first external cavity; wherein for the second gain medium, the second facet defines a first end of a second external cavity and the common feedback assembly defines a second end of the second external cavity;
   a feedback mover that rotates the reflector assembly to continuously adjusts an angle of incidence of the beams on at least a portion of the common feedback assembly to adjust each external cavity simultaneously;

a position detector that generates a first position signal when the reflector assembly is at a first device position, and a second position signal when the reflector assembly is at a second device position; and a control system that selectively and individually directs power to the first gain medium and the second gain medium; wherein the control system directs a first pulse of power to the first gain medium upon receipt of the first position signal to generate a first pulse of light having a first center wavelength, and wherein the control system directs a second pulse of power to the second gain medium upon receipt of the second position signal to generate a second pulse of light having a second center wavelength that is different than the first center wavelength.

2. The laser source of claim 1 wherein the position detector that generates a position signal that relates to the angle of incidence of the beams on the common feedback assembly; and wherein the control system selectively directs power to the gain mediums based on the position signal from the position detector.

3. The laser source of claim 2 wherein the control system determines a center wavelength of the beams based on the position signal.

4. The laser source of claim 1 further comprising a beam redirector assembly that redirects the first beam the exits the second facet from the first gain medium, and the second beam that exits the second facet from the second gain medium so that the beams are approximately coaxial.

5. The laser source of claim 1 further comprising a third gain medium having a first facet and a partly reflective second facet, the third gain medium generating a third beam that exits the first facet and the second facet; wherein the common feedback assembly is positioned in the path of the third beam, the feedback assembly redirecting at least a portion of the third beam back to the third gain medium; wherein for the third gain medium, the second facet defines a first end of a third external cavity and the common feedback assembly defines a second end of the third external cavity; and wherein the control system also selectively and individually directs power to the third gain medium.

6. The laser source of claim 5 wherein the position detector generates a third position signal when the reflector assembly is at a third device position; and wherein the control system directs a third pulse of power to the third gain medium upon receipt of the third position signal.

7. The laser source of claim 1 wherein the common feedback assembly includes a first diffraction grating, a second diffraction grating that is separate from the first diffraction grating, and a third diffraction grating that is separate from the first diffraction grating and the second diffraction grating; wherein the reflector assembly directs a portion of the first beam at the first diffraction grating and the first diffraction grating redirects a portion of the first beam back at the reflector assembly; wherein the reflector assembly directs a portion of the second beam at the second diffraction grating and the second diffraction grating redirects a portion of the second beam back at the reflector assembly; and wherein the reflector assembly directs a portion of the third beam at the third diffraction grating and the third diffraction grating redirects a portion of the third beam back at the reflector assembly.

8. The laser source of claim 7 wherein the first diffraction grating defines the second end of the first external cavity, the second diffraction grating defines the second end of the second external cavity, and the third diffraction grating defines the second end of the third external cavity.

9. The laser source of claim 1 wherein the reflector assembly includes a multi-faceted mirror.

10. A method for generating an output beam that consists of a plurality of output pulses of light, with at least some of the output pulses having a different center wavelength, the method comprising the steps of:

generating a first beam with a first gain medium, the first gain medium having a first facet and a partly reflective second facet, the first gain medium generating a first beam that exits the first facet and second facet;

generating a second beam with a second gain medium, the second gain medium having a first facet and a partly reflective second facet, the second gain medium generating a second beam that exits the first facet and second facet;

positioning a common feedback assembly in the path of the first beam and the second beam, the common feedback assembly redirecting at least a portion of the first beam back to the first gain medium and at least a portion of the second beam back to the second gain medium; wherein the common feedback assembly includes a reflector assembly that redirects at least a portion of the first beam to the first gain medium and at least a portion of the second beam to the second gain medium; wherein for the first gain medium, the second facet defines a first end of a first external cavity and the common feedback assembly defines a second end of the first external cavity; wherein for the second gain medium, the second facet defines a first end of a second external cavity and the common feedback assembly defines a second end of the second external cavity; and rotating the reflector assembly with a feedback mover to continuously adjust an angle of incidence of the beams on at least a portion of the feedback assembly to adjust each external cavity simultaneously;

generating a first position signal when the reflector assembly is at a first device position and a second position signal when the reflector assembly is at a second device position with a position detector; and selectively and individually directing power to the first gain medium and the second gain medium with a control system; the control system directing a first pulse of power to the first gain medium upon receipt of the first position signal to generate a first pulse of light having a first center wavelength, and the control system directing a second pulse of power to the second gain medium upon receipt of the second position signal to generate a second pulse of light having a second center wavelength that is different than the first center wavelength.

11. The method of claim 10 further comprising the step of generating a third beam with a third gain medium, the third gain medium having a first facet and a partly reflective second facet, the third gain medium generating a third beam that exits the first facet and second facet; wherein the common feedback assembly is positioned in the path of the third beam, the feedback assembly redirecting at least a portion of the third beam back to the third gain medium; wherein for the third gain medium, the second facet defines a first end of a third external cavity and the common feedback assembly defines a second end of the third external cavity; and wherein the control system also selectively and individually directs power to the third gain medium.

12. The method of claim 11 further comprising the step of generating a third position signal when the reflector assembly is at a third device position; wherein the step of selectively and individually directing power includes directing a third pulse of power to the third gain medium upon receipt of the third position signal.

13. A laser source for emitting an output beam that consists of a plurality of output pulses of light, with at least some of the output pulses having a different center wavelength, the laser source comprising:
a first gain medium having a first facet and a second facet, the first gain medium generating a first beam that exits the first facet and the second facet;
a second gain medium having a first facet and a second facet, the second gain medium generating a second beam that exits the first facet and the second facet;
a third gain medium having a first facet and a second facet, the third gain medium generating a third beam that exits the first facet and second facet;
a common feedback assembly positioned in the path of the first beam, the second beam, and the third beam, the common feedback assembly redirecting at least a portion of the first beam back to the first gain medium, at least a portion of the second beam back to the second gain medium, and at least a portion of the third beam back to the third gain medium; wherein the common feedback assembly includes a reflector assembly that redirects at least a portion of the first beam to the first gain medium, at least a portion of the second beam to the second gain medium, and at least a portion of the third beam to the third gain medium; wherein for the first gain medium, the common feedback assembly defines an end of the first external cavity; wherein for the second gain medium, the common feedback assembly defines an end of the second external cavity; and wherein for the third gain medium, the common feedback assembly defines an end of the third external cavity;
a feedback mover that rotates the reflector assembly to continuously adjusts an angle of incidence of the beams on at least a portion of the feedback assembly to adjust each external cavity simultaneously;
a position detector that generates a first position signal when the reflector assembly is at a first device position, a second position signal when the reflector assembly is at a second device position; and a third position signal when the reflector assembly is at a third device position; and
a control system that selectively and individually directs power to the first gain medium, the second gain medium, and the third gain medium;
a control system that selectively and individually directs power to the first gain medium, the second gain medium, and the third gain medium; wherein the control system directs a first pulse of power to the first gain medium upon receipt of the first position signal to generate a first pulse of light having a first center wavelength, directs a second pulse of power to the second gain medium upon receipt of the second position signal to generate a second pulse of light having a second center wavelength that is different than the first center wavelength, and directs a third pulse of power to the third gain medium upon receipt of the third position signal to generate a third pulse of light having a third center wavelength that is different than the first center wavelength and the second center wavelength.

14. The laser source of claim 13 wherein the control system sequentially directs pulses of power to the gain mediums.

15. The laser source of claim 13 wherein the common feedback assembly includes a grating assembly, wherein the reflector assembly directs a portion of each beam at the grating assembly and the grating assembly redirects a portion of each beam back at the reflector assembly.

16. The laser source of claim 15 wherein the grating assembly includes a first diffraction grating, a second diffraction grating that is separate from the first diffraction grating, and a third diffraction grating that is separate from the first diffraction grating and the second diffraction grating.

17. The laser source of claim 16 wherein the first diffraction grating defines the end of the first external cavity, the second diffraction grating defines the end of the second external cavity, and the third diffraction grating defines the end of the third external cavity.

18. The laser source of claim 13 wherein the reflector assembly includes a multi-faceted mirror.

19. The laser source of claim 13 further comprising a beam redirector assembly that redirects the first beam the exits the second facet from the first gain medium, the second beam that exits the second facet from the second gain medium, and the third beam that exits the second facet from the third gain medium so that the beams are approximately coaxial.

* * * * *